United States Patent
Tomimatsu et al.

(10) Patent No.: US 9,331,114 B2
(45) Date of Patent: May 3, 2016

(54) IMAGE PICKUP DEVICE AND METHOD OF MANUFACTURING THE SAME

(71) Applicant: Renesas Electronics Corporation, Kanagawa (JP)

(72) Inventors: Takahiro Tomimatsu, Kanagawa (JP); Takeshi Kamino, Kanagawa (JP); Takeshi Kawamura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/024,117

(22) Filed: Sep. 11, 2013

(65) Prior Publication Data

US 2014/0070288 A1    Mar. 13, 2014

(30) Foreign Application Priority Data

Sep. 11, 2012 (JP) ................................. 2012-199621

(51) Int. Cl.
*H01L 27/14* (2006.01)
*H01L 27/146* (2006.01)

(52) U.S. Cl.
CPC .... *H01L 27/14625* (2013.01); *H01L 27/14629* (2013.01); *H01L 27/14685* (2013.01)

(58) Field of Classification Search
CPC .................. H01L 27/14609; H01L 27/14643; H01L 27/14603; H01L 27/14689; H01L 27/1463
USPC ............................................ 438/69; 257/292
See application file for complete search history.

(56) References Cited

U.S. PATENT DOCUMENTS

| 7,298,955 | B2 | 11/2007 | Kooriyama |
| 8,300,128 | B2 | 10/2012 | Toumiya |
| 8,384,173 | B2 * | 2/2013 | Matsugai ...................... 257/432 |
| 8,525,909 | B2 * | 9/2013 | Matsumoto et al. .......... 348/308 |
| 8,679,922 | B2 | 3/2014 | Kondo et al. |
| 8,866,251 | B2 | 10/2014 | Hirano |

FOREIGN PATENT DOCUMENTS

| JP | 2006-310825 A | 11/2006 |
| JP | 2006-351759 A | 12/2006 |
| JP | 2007-173258 A | 7/2007 |
| JP | 2009-176952 A | 8/2009 |
| JP | 2009-272568 A | 11/2009 |
| JP | 2012-164942 A | 8/2012 |

OTHER PUBLICATIONS

Japanese Office Action issued in Japanese Patent Application No. 2012-199621, mailing date Dec. 1, 2015.

* cited by examiner

*Primary Examiner* — Monica D Harrison
(74) *Attorney, Agent, or Firm* — Sughrue Mion, PLLC

(57) ABSTRACT

To prevent deterioration in the sensitivity of a pixel part caused by variation in the distance between a waveguide and a photo diode and by decay of light due to suppression of reflection of entering light. In a pixel region, there is formed a waveguide which penetrates through a fourth interlayer insulating film or the like and reaches a sidewall insulating film. The sidewall insulating film is configured to have a stacked structure of a silicon oxide film and a silicon nitride film. The waveguide is formed so as to penetrate through even the silicon nitride film of the sidewall insulating film and to reach the silicon oxide film of the sidewall insulating film, or so as to reach the silicon nitride film of the sidewall.

20 Claims, 34 Drawing Sheets

IMAGE PICKUP DEVICE AND METHOD OF MANUFACTURING THE SAME

CROSS-REFERENCE TO RELATED APPLICATION

The disclosure of Japanese Patent Application No. 2012-199621 filed on Sep. 11, 2012 including the specification, drawings and abstract is incorporated herein by reference in its entirety.

BACKGROUND

The present invention relates to an image pickup device and a method of manufacturing the same, in particular, which can preferably be utilized for image pickup devices equipped with a waveguide.

To digital cameras and the like, an image pickup device equipped with, for example, a CMOS (Complementary Metal Oxide Semiconductor) image sensor is applied. Such an image pickup device includes a pixel part in which a photo diode that converts entering light to charges is formed, and a peripheral circuit part that performs processing or the like, as an electric signal, of the charges having been converted by the pixel part.

Recently, in order to cope with reduction in size of digital cameras and the like, an image pickup device is increasingly required to have a small pixel size of a pixel part. Along with the reduction in the pixel size, the quantum efficiency inside silicon (Si) tends to become lower. The quantum efficiency denotes a number of output electrons per one photon, and a higher quantum efficiency inside silicon (Si) means that the pixel part has a higher sensitivity.

In order to improve the quantum efficiency inside silicon (Si) as much as possible, there is proposed an image pickup device equipped with a waveguide that guides light to a photo diode of a pixel part. In the image pickup device of this kind, the waveguide is formed by performing etching on an interlayer insulating film covering the photo diode to thereby form an opening part, and by filling a predetermined embedding material into the opening part. Note that, as Patent Documents disclosing an image pickup device equipped with a waveguide, there are Japanese Patent Laid-Open Nos. 2006-351759 and 2006-310825.

SUMMARY

In conventional image pickup devices, the following problem exists. In order to guide efficiently entering light to a photo diode, it is necessary to control the distance between the waveguide and the photo diode (thickness of a remaining film).

In order to control the distance, the present inventors fabricated an image pickup device in which an etching stopper film was inserted in the middle of an interlayer insulating film, and evaluated the device. As a result, it was found that, because a plurality of layers of anti-reflection films was formed including the etching stopper film over the photo diode and thus light decayed, it was necessary to form an opening part (a waveguide) so as to penetrate through the etching stopper film in order to improve the transmittance of a silicon (Si) substrate. Consequently, the above-mentioned structure having an etching stopper film inserted still resulted in variation in the distance between the waveguide and the photo diode, within the wafer face or between rots.

In conventional image pickup devices, there was deterioration in the sensitivity of a pixel part caused by the variation in the distance between a waveguide and a photo diode, and caused by the decay of entering light due to an antireflection film.

The other problems and the new feature will become clear from the description of the present specification and the accompanying drawings.

An image pickup device according to an embodiment includes a sidewall insulating film that covers a side wall face of a gate electrode of a transfer transistor and that includes a part extending from a part covering the side wall face and covering a surface of a photoelectric conversion part, and a waveguide that is formed so as to penetrate through an interlayer insulating film to reach the sidewall insulating film and that guides light to a photoelectric conversion part.

A method of manufacturing an image pickup device according to another embodiment includes steps of, by forming a predetermined insulating film so as to cover a gate electrode and a photoelectric conversion part of a transfer transistor and by performing processing on the predetermined insulating film, forming a sidewall insulating film that covers a side wall face of the gate electrode and that includes a part extending from a part covering the side wall face to cover a surface of the photoelectric conversion part; and forming an opening part reaching the sidewall insulating film in the interlayer insulating film and forming, in the opening part, a waveguide leading light to the photoelectric conversion part.

According to the image pickup device according to one embodiment, it becomes possible to enhance the sensitivity of the pixel part, and to suppress variation in the sensitivity of each pixel within the wafer face due to the variation in the distance between the waveguide and the photodiode, and variation in the sensitivity between rots.

According to the method of manufacturing an image pickup device according to another embodiment, it is possible to manufacture an image pickup device capable of enhancing the sensitivity of the pixel part.

DETAILED DESCRIPTION

Figure 1:
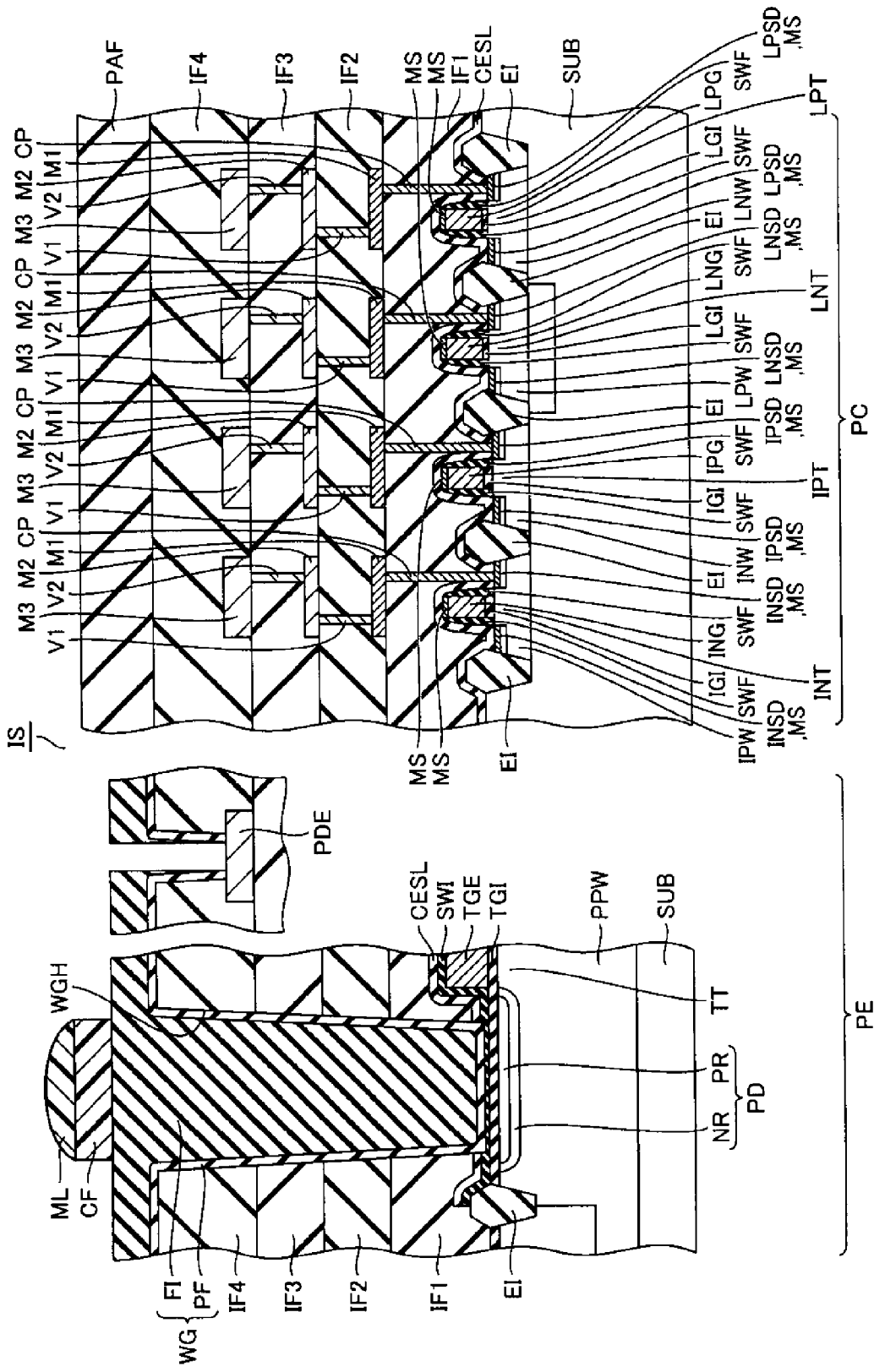
FIG. 1 is a cross-sectional view of an image pickup device according to an embodiment.

The image pickup device according to the embodiment and the method of manufacturing the same will be described. As shown in FIG. 1, in an image pickup device IS, by forming an element isolation insulating film EI on a semiconductor substrate SUB, a pixel region PE and a periphery circuit region PC are defined. In the pixel region PE, from the surface to a predetermined depth of the semiconductor substrate SUB, a p-type well PPW is formed. For the p-type well PPW, there are formed a photo diode PD that converts light entering from the outside into charges, and a transfer transistor TT that transfers the charges.

The photo diode PD has an n-type region NR and a p-type region PR, which are formed in each of predetermined depths from the surface of the p-type well PPW. The transfer transistor TT has a gate electrode TGE of the transfer transistor TT formed over the surface of the p-type well PPW, with a gate insulating film TGI being interposed therebetween. A sidewall insulating film SWI that covers the side wall face of the gate electrode TGE is formed. The sidewall insulating film SWI includes a part that extends from the part covering the side wall face to cover the photo diode PD. The sidewall insulating film SWI formed in the pixel region PE is intended to be one that includes, in addition to a part covering the side wall face of the gate electrode TGE, a part that extends from the part to cover the photo diode PD. So as to cover the sidewall insulating film SWI, a contact etch stress liner film CESL is formed.

In contrast, the periphery circuit region PC has a pixel transistor region in which a transistor of a pixel that processes the electric signal converted from charges is formed, and a logic region in which a transistor for a logic circuit that exchanges various signals is formed.

In the pixel transistor region, from the surface to a predetermined depth of the semiconductor substrate SUB, each of a p-type well IPW and an n-type well INW is formed. In the p-type well IPW, an n-channel type MOS transistor INT is formed, and in the n-type well INW, a p-channel type MOS transistor IPT is formed.

The n-channel type MOS transistor INT has a gate electrode ING and n-type source/drain regions INSD. The gate electrode ING is formed over the surface of the p-type well IPW with the gate insulating film IGI being interposed. The p-channel type MOS transistor IPT has a gate electrode IPG and p-type source/drain regions IPSD. The gate electrode IPG is formed over the surface of the n-type well INW with the gate insulating film IGI being interposed.

In the logic region, from the surface to a predetermined depth of the semiconductor substrate SUB, each of a p-type well LPW and an n-type well LNW is formed. In the p-type well LPW, an n-channel type MOS transistor LNT is formed, and in the n-type well LNW, a p-channel type MOS transistor LPT is formed.

The n-channel type MOS transistor LNT has a gate electrode LNG and n-type source/drain regions LNSD. The gate electrode LNG is formed over the surface of the p-type well LPW with a gate insulating film LGI being interposed. The p-channel type MOS transistor LPT has a gate electrode LPG and p-type source/drain regions LPSD. The gate electrode LPG is formed over the surface of the n-type well LNW with the gate insulating film LGI being interposed.

On a side wall face of each of the gate electrodes ING, IPG, LNG and LPG, a sidewall insulating film SWF is formed. On the surface (upper face) of each of the gate electrodes ING, IPG, LNG and LPG, the surface of each of n-type source/drain regions INSD and LNSD, and the surface of each of p-type source/drain regions IPSD and LPSD, a metal silicide film MS is formed. So as to cover the gate electrodes ING, IPG, LNG, LPG and the like, a contact etch stress liner film CESL is formed.

So as to cover the photo diode PD, the transfer transistor TT, the n-channel type MOS transistors INT and LNT, the p-channel type MOS transistors IPT and LPT or the like, a first interlayer insulating film IF1 is formed as a contact interlayer insulating film. On the surface of the first interlayer insulating film IF1, a first wiring M1 is formed. The first wiring M1 is electrically coupled, respectively, to corresponding n-type source/drain regions INSD and LNSD, and p-type source/drain regions IPSD and LPSD, by a contact plug CP. The contact plug CP is formed so as to penetrate through the first interlayer insulating film IF1.

So as to cover the first wiring M1, over the first interlayer insulating film IF1, a second interlayer insulating film IF2 is formed. On the surface of the second interlayer insulating film IF2, a second wiring M2 is formed. The first wiring M1 and the corresponding second wiring M2 are electrically coupled to each other by a first via V1. The first via V1 is formed so as to penetrate through the second interlayer insulating film IF2.

So as to cover the second wiring M2, over the second interlayer insulating film IF2, a third interlayer insulating film IF3 is formed. On the surface of the third interlayer insulating film IF3, a third wiring M3 and a pad PDE are formed. The third wiring M3 and the corresponding second wiring M2 are electrically coupled to each other by a second via V2. The second via V2 is formed so as to penetrate through the third interlayer insulating film IF3.

So as to cover the third wiring M3 and the pad PDE, over the third interlayer insulating film IF3, a fourth interlayer insulating film IF4 is formed. In the periphery circuit region PC, so as to cover the fourth interlayer insulating film IF4, a passivation film PAF is formed.

In the pixel region PE, there is formed a waveguide WG which penetrates through the fourth interlayer insulating film IF4, the third interlayer insulating film IF3, the second interlayer insulating film IF2, the first interlayer insulating film IF1 and the contact etch stress liner film CESL, and which reaches the sidewall insulating film SWI. The waveguide WG has a protective film PF formed on the surface of a waveguide opening part WGH formed so as to penetrate through the fourth interlayer insulating film IF4 or the like, and an embedding member FI that fills the waveguide opening part WGH covered with the protective film PF. As the protective film PF, for example, a silicon nitride film is applied. As the embedding member FI, a coating-based material is applied, and for example, a siloxane-based material is used. Over the waveguide WG, a color filter CF and a micro lens ML are formed.

In the image pickup device IS according to the present embodiment, the sidewall insulating film SWI is configured to have a stacked structure including a silicon oxide film SWO and a silicon nitride film SWN (see FIGS. 2 and 3), and over the silicon oxide film, the silicon nitride film is formed. The sidewall insulating film SWI includes a part that covers the side wall face of the gate electrode TGE, and a part that extends from the part covering the side wall face to cover the photo diode PD. For the sidewall insulating film SWI (the part that covers the photo diode PD), as a formation mode of the waveguide WG, there are two formation modes, a first formation mode and a second formation mode.

Figure 2:
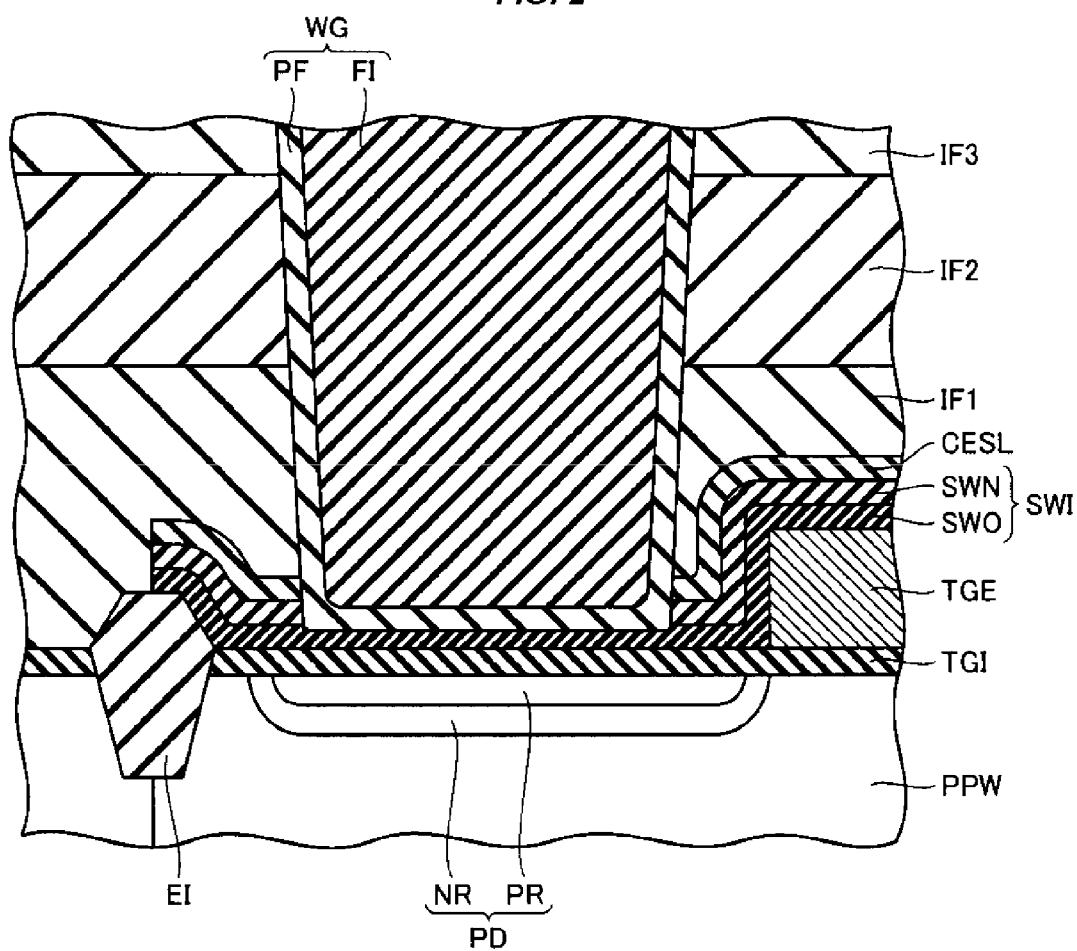
FIG. 2 is a first partially enlarged cross-sectional view of a pixel region, in the embodiment.
Figure 3:
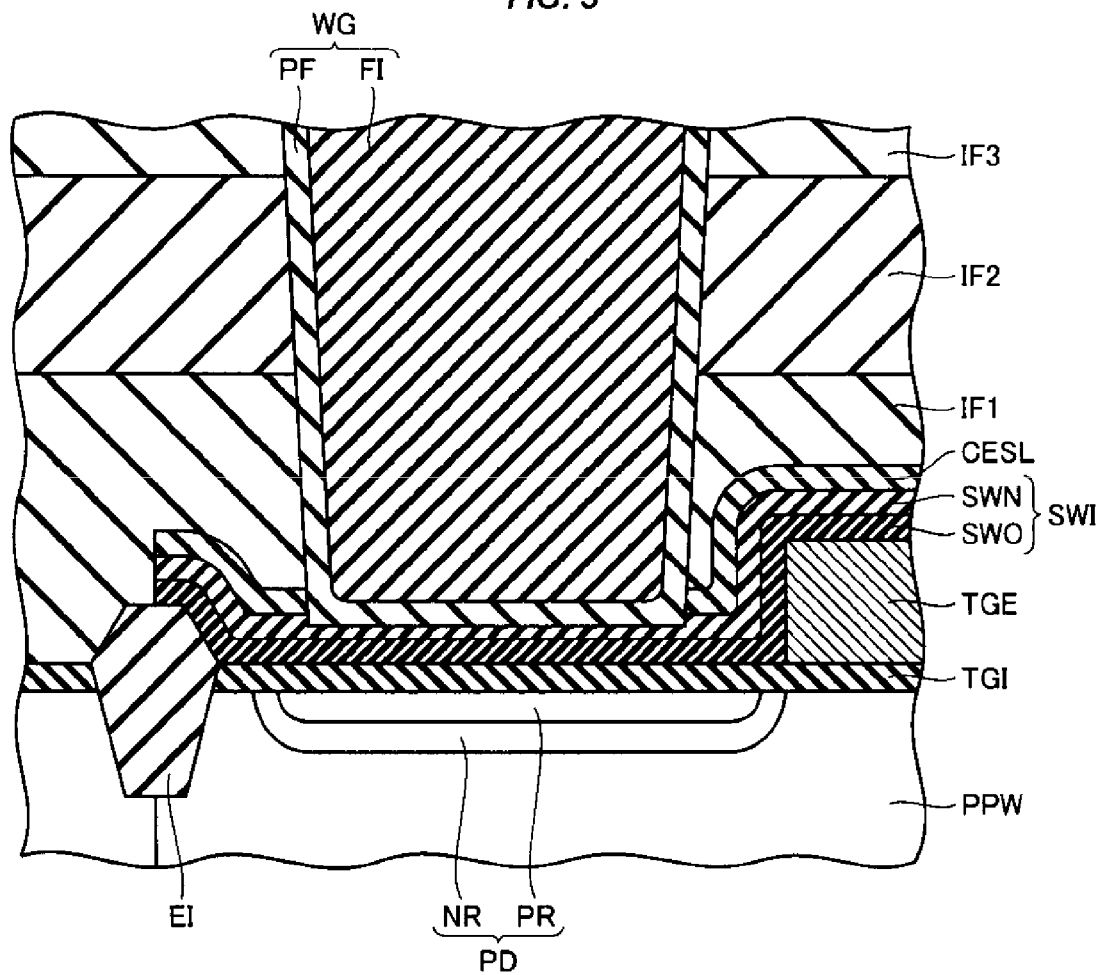
FIG. 3 is a second partially enlarged cross-sectional view of the pixel region, in the embodiment.

That is, in the first formation mode, as shown in FIG. 2, the waveguide WG is formed so as to penetrate through even the silicon nitride film SWN of the sidewall insulating film SWI and to reach the silicon oxide film SWO of the sidewall insulating film SWI. In the second formation mode, as shown in FIG. 3, the waveguide WG is formed so as to reach the silicon nitride film SWN of the sidewall. As described later, the waveguide WG is formed into the first formation mode or into the second formation mode, and thus the deterioration in the sensitivity of the pixel part is suppressed.

Figure 4:
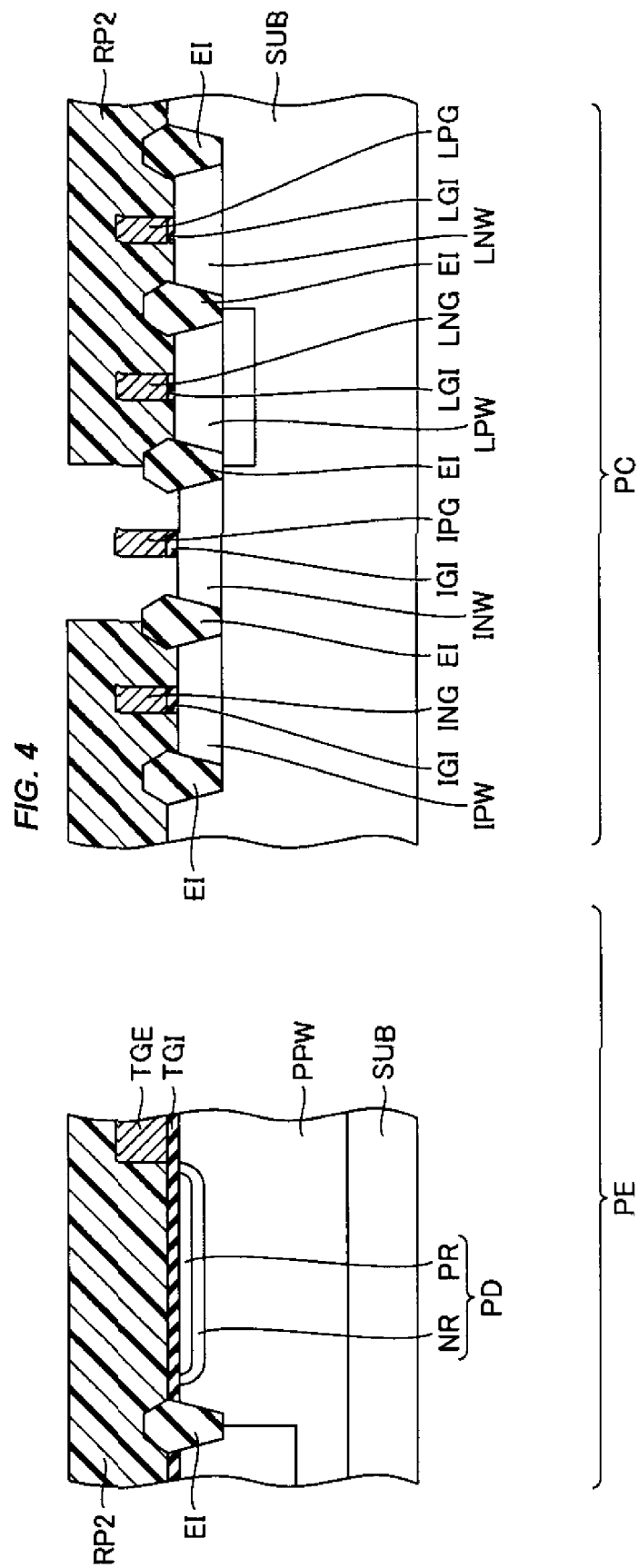
FIG. 4 is a cross-sectional view showing a process of a method of manufacturing the image pickup device, in the embodiment.

Next, an example of a method of manufacturing the above-mentioned image pickup device will be described. First, as shown in FIG. 4, by forming the element isolation insulating film EI on the semiconductor substrate SUB, the pixel region PE and the periphery circuit region PC are defined.

Next, in the pixel region PE, the gate electrode TGE and the photo diode PD are formed. In the periphery circuit region PC, the gate electrodes ING, IPG, LNG and LPG are formed. Next, by performing a predetermined photolithography process, there is formed a resist pattern RP2 which allows the n-type well INW on which the gate electrode IPG is formed to be exposed, and covers the other regions. Next, by implanting a p-type impurity through the use of the resist pattern RP2 as a mask, an extension region (not shown) is formed. After that, the resist pattern RP2 is removed.

Figure 5:
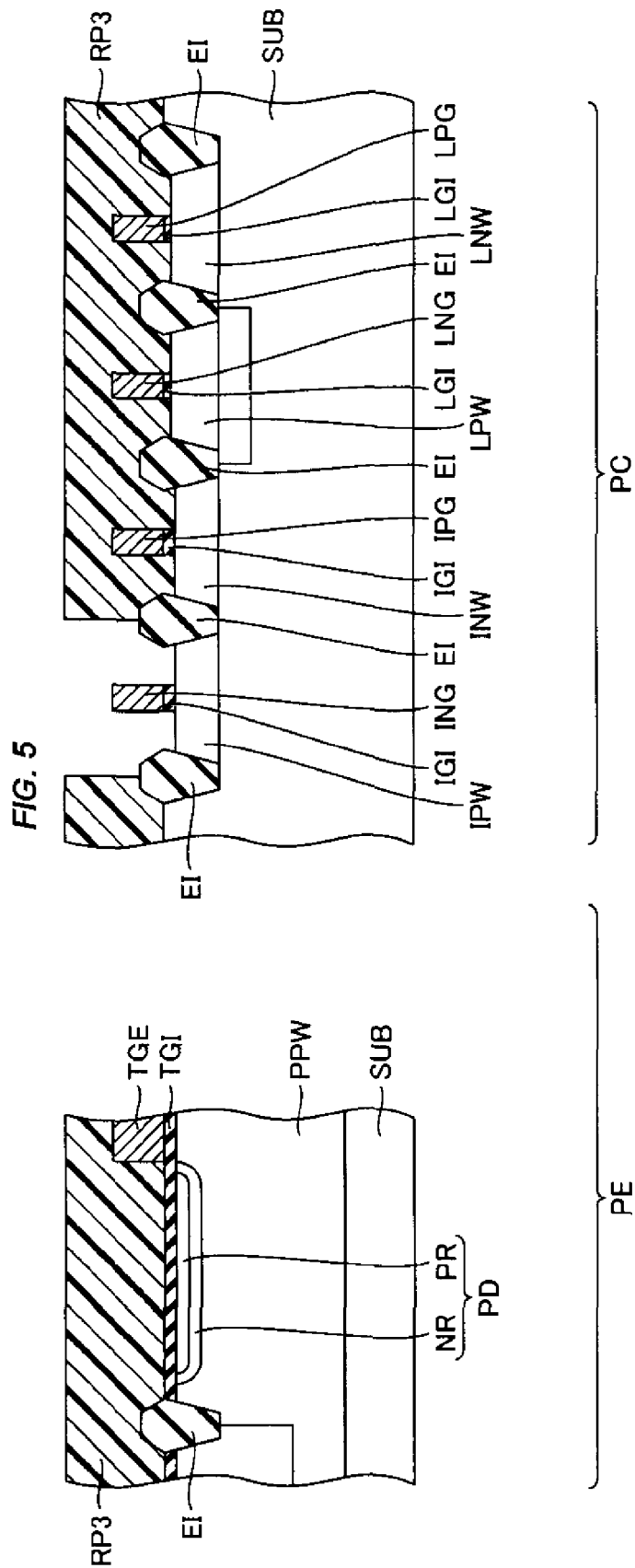
FIG. 5 is a cross-sectional view showing a process that is carried out after the process shown in FIG. 4, in the embodiment.

Next, as shown in FIG. 5, by performing a predetermined photolithography process, there is formed a resist pattern RP3 which allows the p-type well IPW on which the gate electrode ING is formed to be exposed, and covers the other regions. Next, by implanting an n-type impurity through the use of the resist pattern RP3 as a mask, an extension region (not shown) is formed. After that, the resist pattern RP3 is removed.

Figure 6:
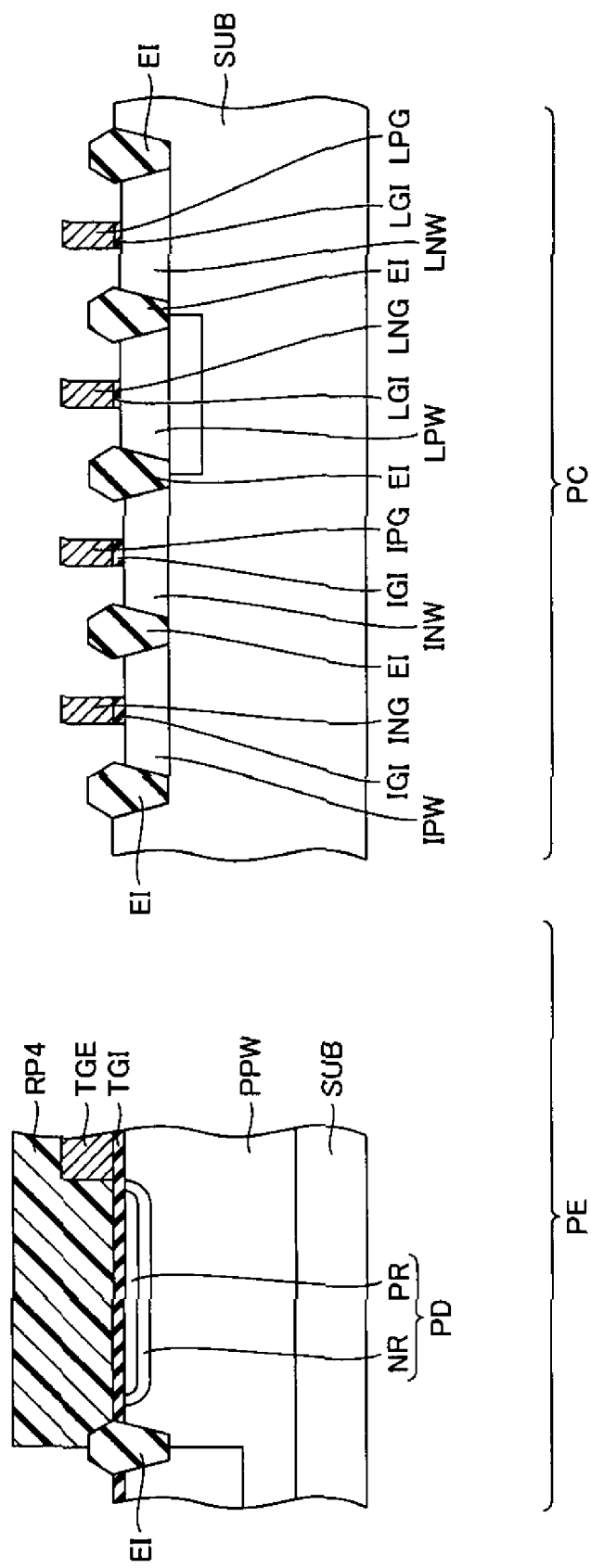
FIG. 6 is a cross-sectional view showing a process that is carried out after the process shown in FIG. 5, in the embodiment.

Next, if necessary, an offset spacer film is formed on the side wall faces of the gate electrodes ING, IPG, LNG and LPG. First, so as to cover the gate electrode TGE and the gate electrodes ING, IPG, LNG and LPG, an insulating film (not shown) serving as the offset spacer film is formed. Next, as shown in FIG. 6, through the use of, as a mask, a resist pattern RP4 which covers the photo diode PD and allows the other regions to be exposed, etching is performed. By the etching, on the side wall faces of the gate electrodes ING, IPG, LNG and LPG, an offset spacer film (not shown) is formed.

Figure 7:
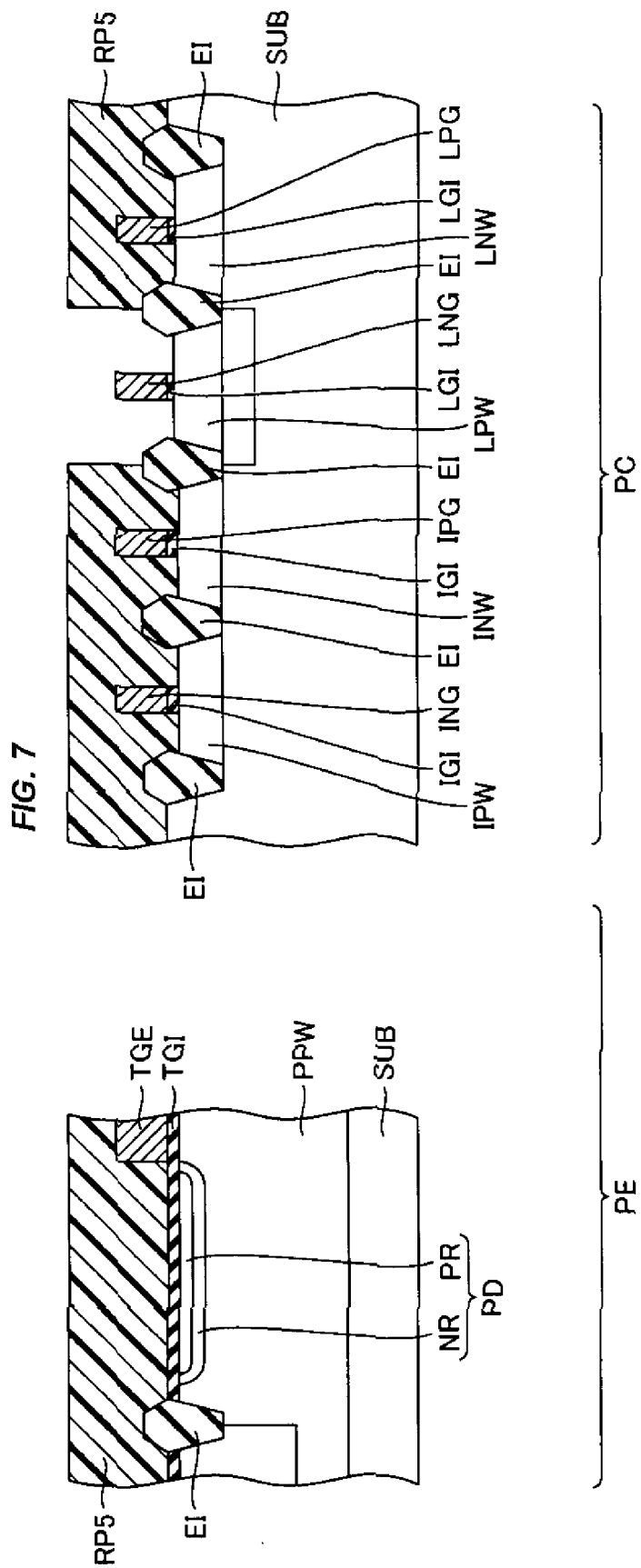
FIG. 7 is a cross-sectional view showing a process that is carried out after the process shown in FIG. 6, in the embodiment.

Next, as shown in FIG. 7, by performing a predetermined photolithography process, there is formed a resist pattern RP5 which allows the p-type well LPW to be exposed, and covers the other regions. Subsequently, by implanting an n-type impurity through the use of the resist pattern RP5 as a mask, an extension region (not shown) is formed. After that, the resist pattern RP5 is removed.

Figure 8:
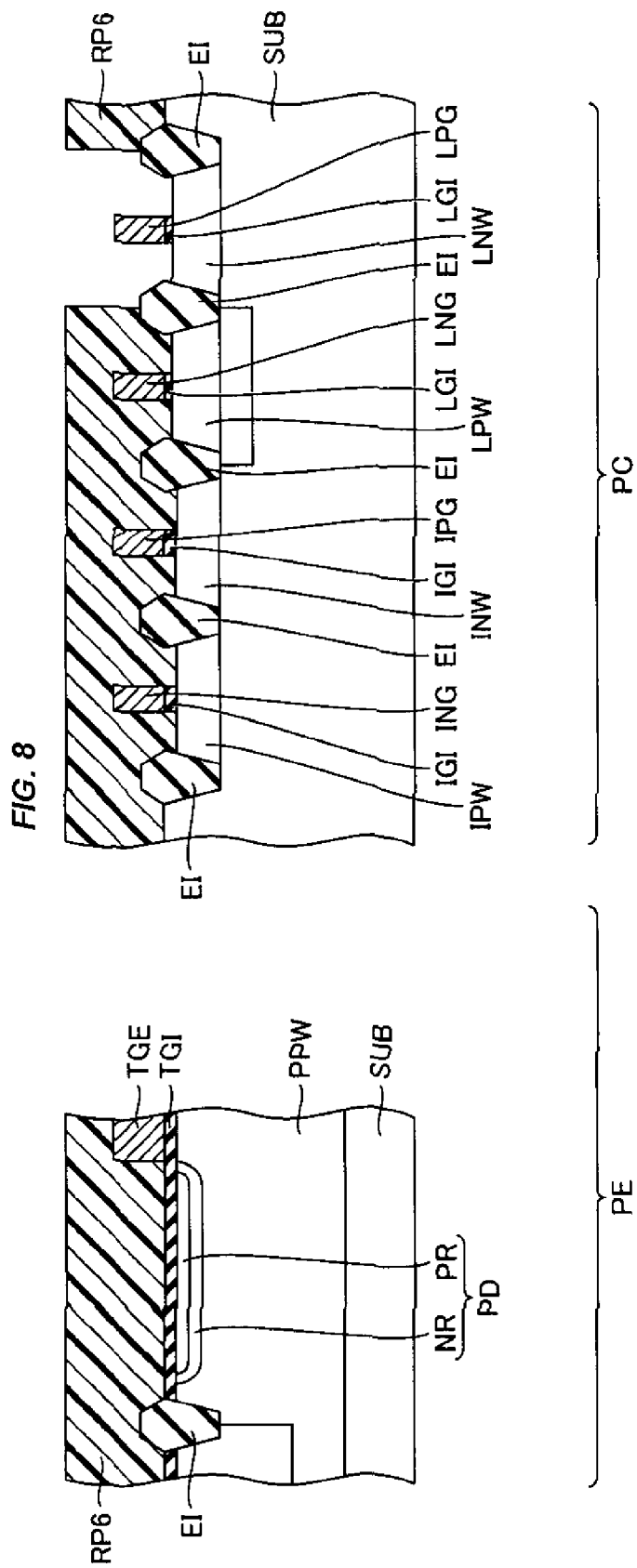
FIG. 8 is a cross-sectional view showing a process that is carried out after the process shown in FIG. 7, in the embodiment.

Next, as shown in FIG. 8, by performing a predetermined photolithography process, there is formed a resist pattern RP6 which allows the n-type well LNW to be exposed, and covers the other regions. Subsequently, by implanting a p-type impurity through the use of the resist pattern RP6 as a mask, an extension region (not shown) is formed. After that, the resist pattern RP6 is removed.

Figure 9:
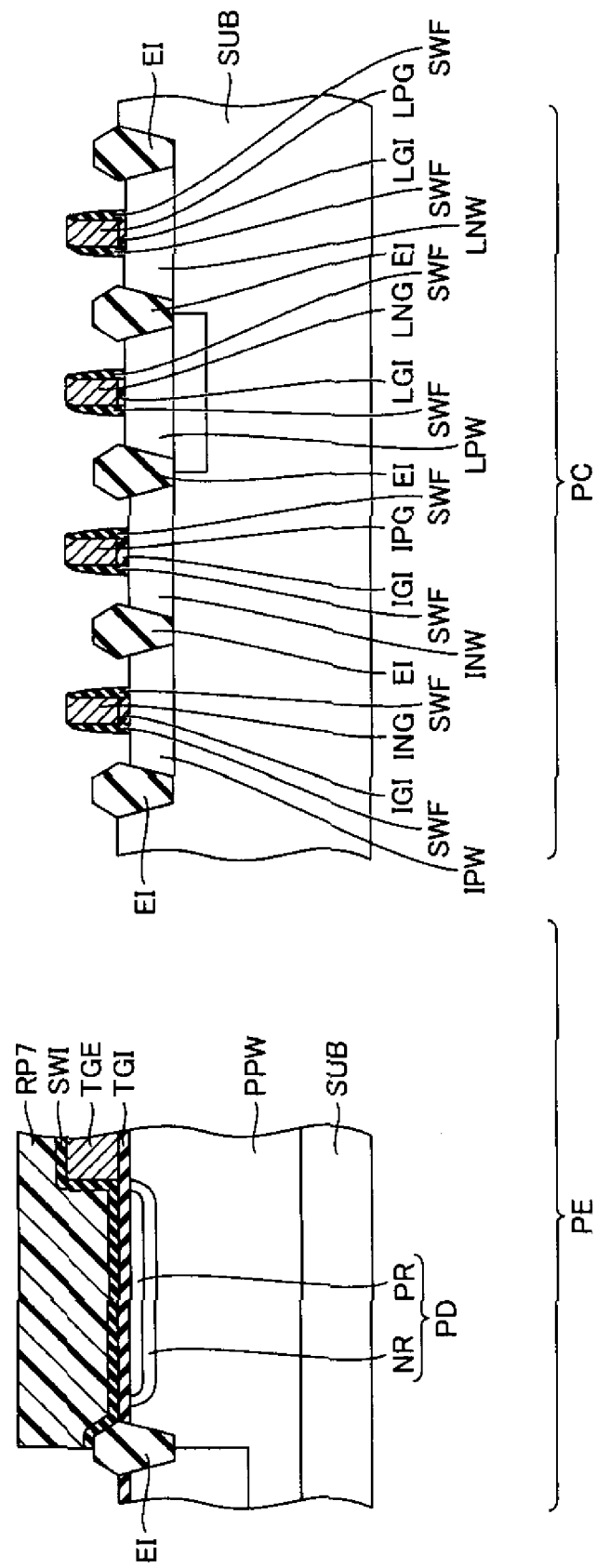
FIG. 9 is a cross-sectional view showing a process that is carried out after the process shown in FIG. 8, in the embodiment.

Next, a sidewall insulating film covering the photo diode PD and the gate electrode TGE is formed. First, so as to cover the gate electrode TGE and the gate electrodes ING, IPG, LNG and LPG, there is formed a predetermined insulating film (not shown) having a stacked structure obtained by stacking a silicon nitride film over a silicon oxide film. Subsequently, as shown in FIG. 9, by performing a predetermined photolithography process, there is formed a resist pattern RP7 which covers the photo diode PD and the gate electrode TGE and allows the other regions to be exposed.

Next, through the use of the resist pattern RP7 as a mask, etching is performed on a predetermined insulating film. Because of this, in the pixel region PE, a remaining insulating film is formed as the sidewall insulating film SWI that covers the photo diode PD and the gate electrode TGE. The sidewall insulating film SWI includes a part that covers the side wall face of the gate electrode TGE, and a part that extends from the part covering the side face to thereby cover the photo diode PD. In the periphery circuit region PC, on the side wall faces of the gate electrodes ING, IPG, LNG and LPG, the sidewall insulating film SWF is formed. After that, the resist pattern RP7 is removed.

Figure 10:
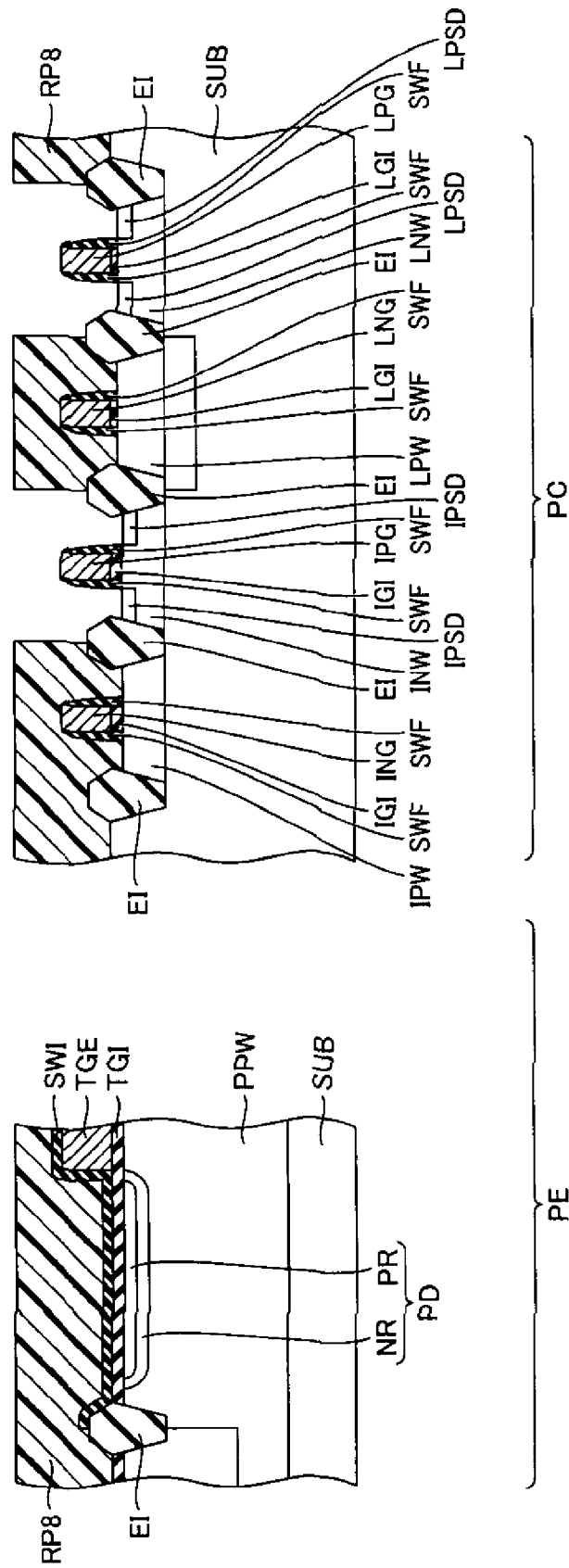
FIG. 10 is a cross-sectional view showing a process that is carried out after the process shown in FIG. 9, in the embodiment.

Next, as shown in FIG. 10, by performing a predetermined photolithography process, a resist pattern RP8 which allows the n-type wells INW and LNW to be exposed and covers the other regions, is formed. Next, by implanting a p-type impurity through the use of the resist pattern RP8 as a mask, in the n-type well INW, the source/drain regions IPSD are formed, and in the n-type well LNW, the source/drain regions LPSD are formed. After that, the resist pattern RP8 is removed.

Figure 11:
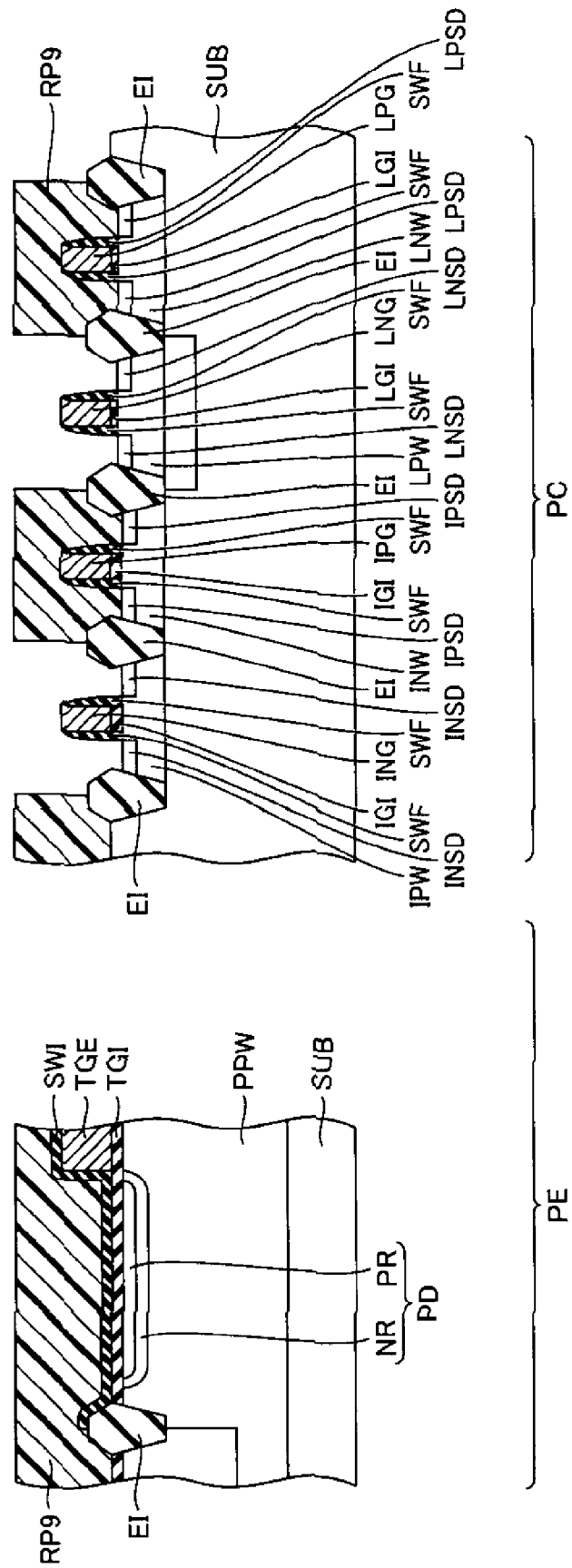
FIG. 11 is a cross-sectional view showing a process that is carried out after the process shown in FIG. 10, in the embodiment.

Next, as shown in FIG. 11, by performing a predetermined photolithography process, a resist pattern RP9, which allows the p-type wells IPW and LPW to be exposed and covers the other regions, is formed. Next, by implanting an n-type impurity through the use of the resist pattern RP9 as a mask, in the p-type well IPW, the source/drain regions INSD are formed, and in the p-type well LPW, the source/drain regions LNSD are formed. After that, the resist pattern RP9 is removed.

Figure 12:
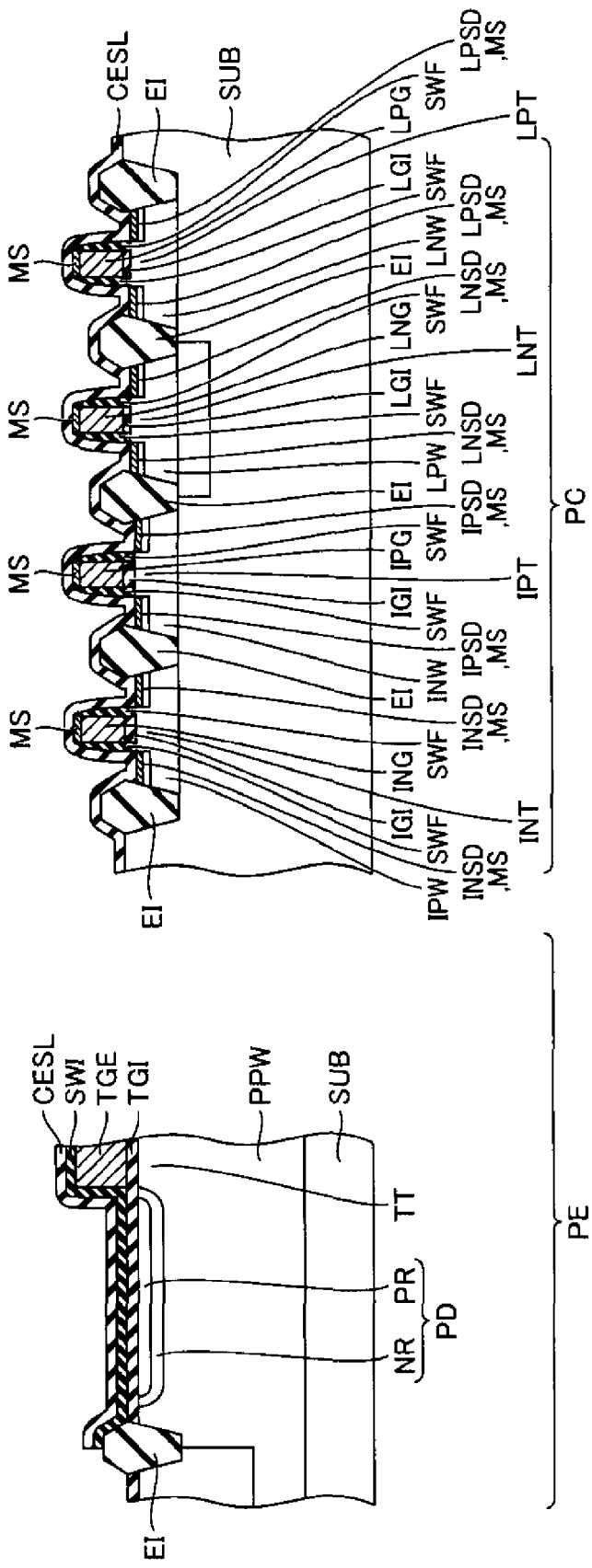
FIG. 12 is a cross-sectional view showing a process that is carried out after the process shown in FIG. 11, in the embodiment.

Next, a silicide block film (not shown) which blocks metal silicidation, is formed in a mode of covering the pixel region PE and allowing the periphery circuit region PC to be exposed. So as to cover the silicide block film and the gate electrodes ING, IPG, LNG, LPG and the like, for example, a metal film (not shown) of cobalt or the like is formed. Next, there is carried out a metal silicidation in which a heat treatment is performed under a predetermined temperature and atmosphere, to cause a metal to react with silicon. After that, an unreacted metal film is removed. Consequently, as shown in FIG. 12, on the upper faces of the gate electrodes ING, IPG, LNG and LPG, a metal silicide film MS is formed, and on the surfaces of the source/drain regions INSD, IPSD, LNSD and LPSD, the metal silicide film MS is formed. Next, so as to cover the gate electrode TGE and the gate electrodes ING, IPG, LNG, LPG and the like, a contact etch stress liner film CESL by, for example, a silicon nitride film is formed.

Figure 13:
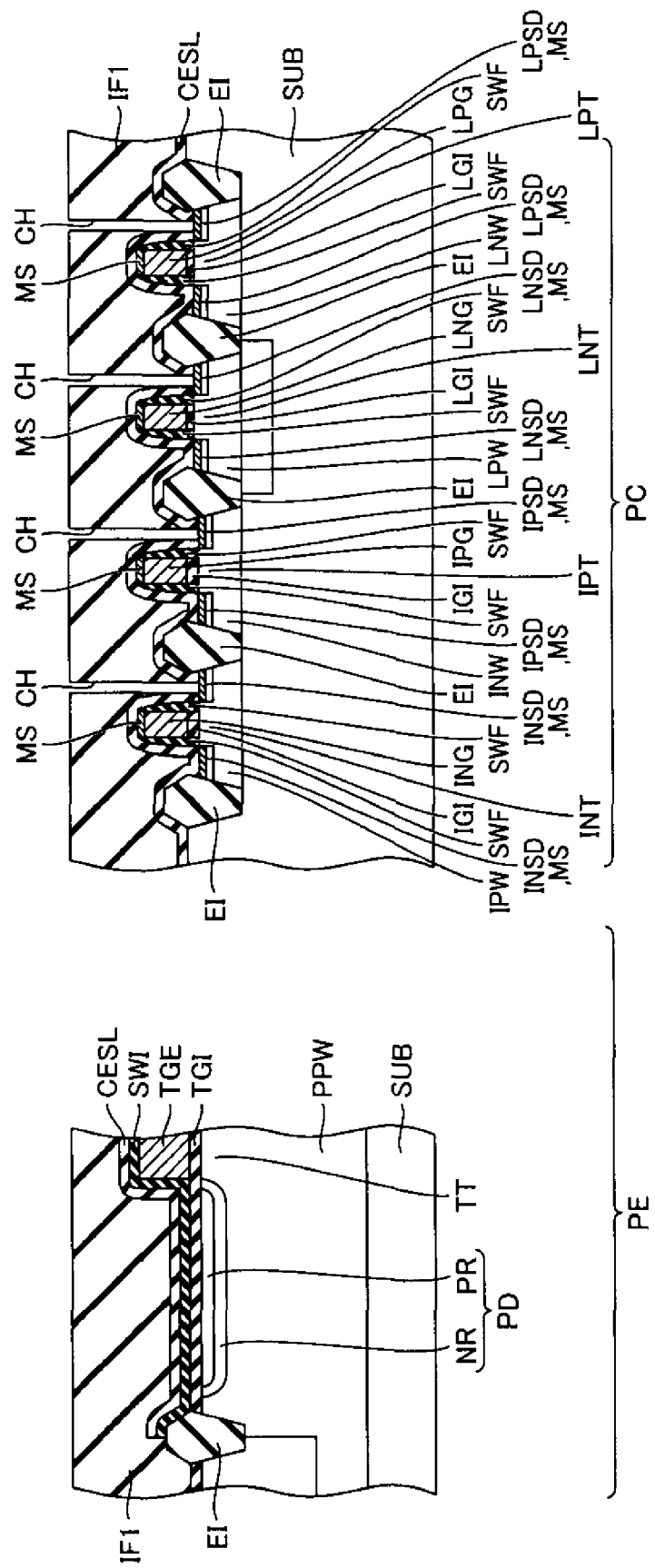
FIG. 13 is a cross-sectional view showing a process that is carried out after the process shown in FIG. 12, in the embodiment.

Next, as shown in FIG. 13, so as to cover the contact etch stress liner film CESL, the first interlayer insulating film IF1 is formed as a contact interlayer insulating film by, for example, a TEOS (Tetra Ethyl Ortho Silicate)-based oxide film. Then, by performing a predetermined photolithography process, a resist pattern (not shown) for forming a contact hole is formed. Subsequently, through the use of the resist pattern as a mask, etching is performed on the first interlayer insulating film IF1, and after that, the resist pattern is removed. Consequently, as shown in FIG. 13, there is formed a contact hole CH which allows each of the source/drain regions INSD, IPSD, LNSD and LPSD (the metal silicide film MS) to be exposed.

Figure 14:
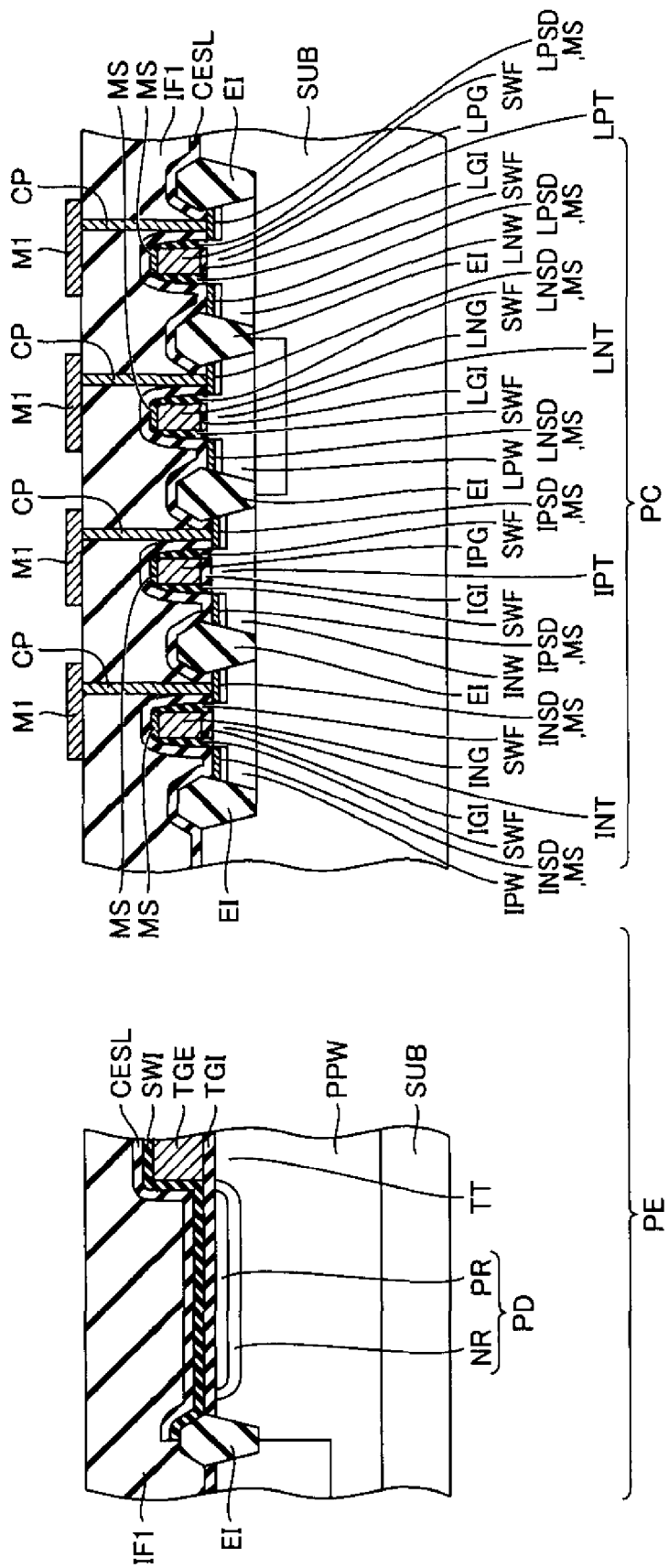
FIG. 14 is a cross-sectional view showing a process that is carried out after the process shown in FIG. 13, in the embodiment.

Next, as shown in FIG. 14, a contact plug PG is formed in the contact hole CH. The contact plug PG includes a barrier metal. Then, so as to cover the first interlayer insulating film IF1, a metal film of, for example, aluminum or the like is formed. Subsequently, by performing a predetermined photolithography process and performing etching on the metal film, the first wiring M1 is formed by aluminum.

Figure 15:
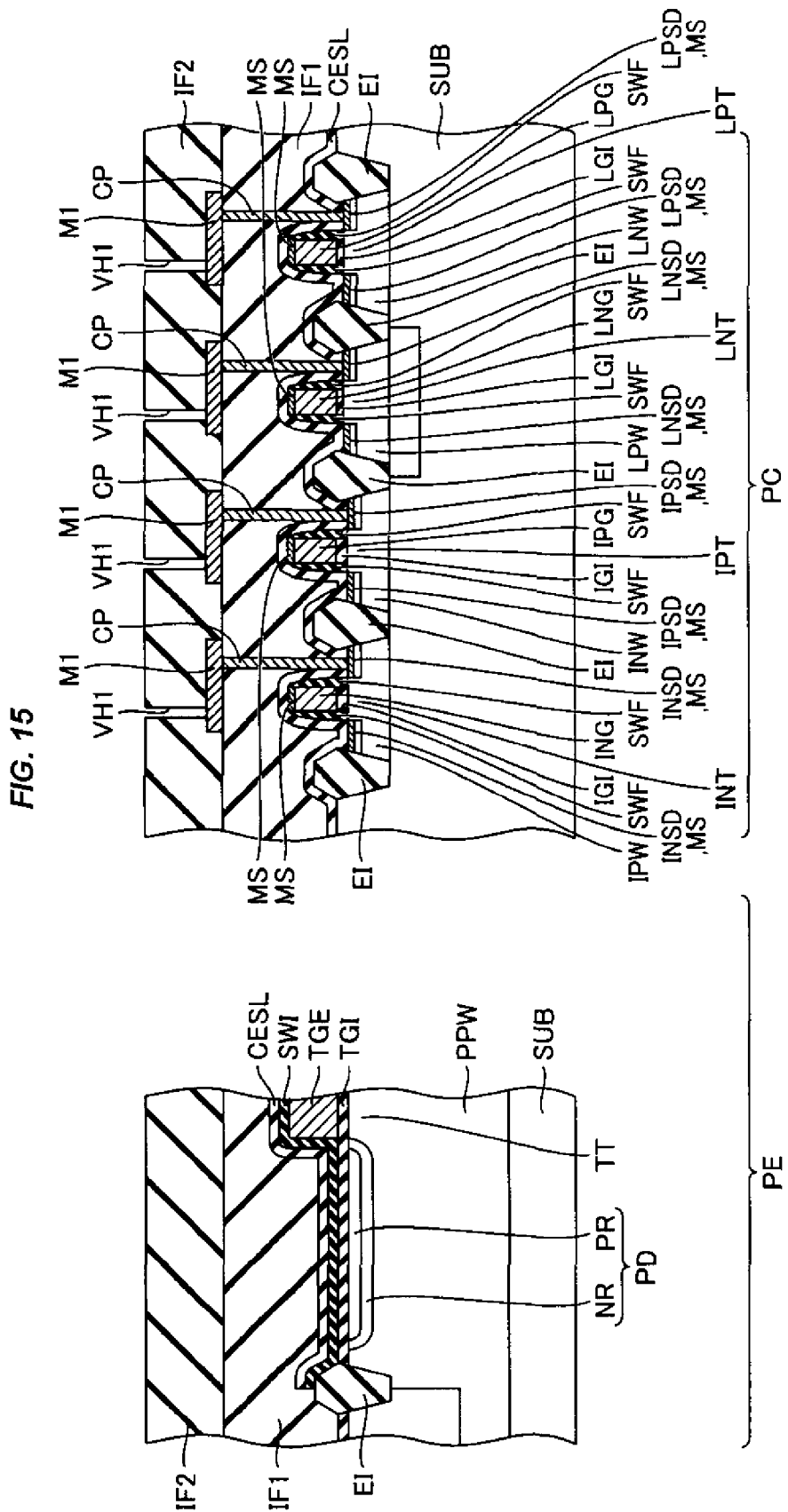
FIG. 15 is a cross-sectional view showing a process that is carried out after the process shown in FIG. 14, in the embodiment.

Next, as shown in FIG. 15, so as to cover the first wiring M1, the second interlayer insulating film IF2 is formed. Then, by performing a predetermined photolithography process, a resist pattern for forming a via hole (not shown) is formed. Subsequently, through the use of the resist pattern as a mask, etching is performed on the second interlayer insulating film IF2, and after that, the resist pattern is removed. Consequently, as shown in FIG. 15, a first via hole VH1 which allows the first wiring M1 to be exposed, is formed.

Figure 16:
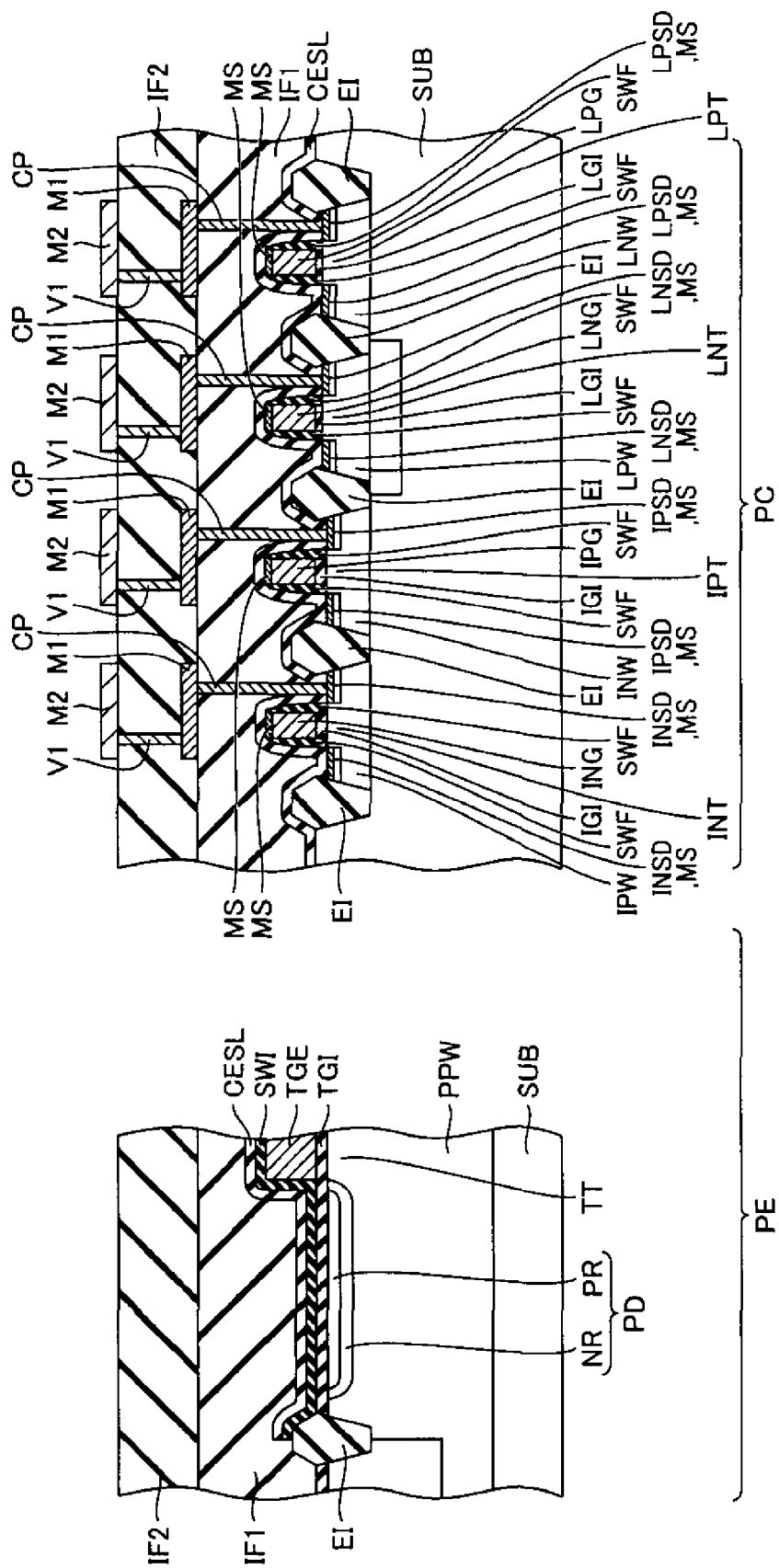
FIG. 16 is a cross-sectional view showing a process that is carried out after the process shown in FIG. 15, in the embodiment.

Next, as shown in FIG. 16, the first via V1 is formed in the first via hole VH1. Next, so as to cover the second interlayer insulating film IF2, a metal film of, for example, aluminum or the like is formed. Subsequently, by performing a predetermined photolithography process and performing etching on the metal film, the second wiring M2 by aluminum is formed.

Figure 17:
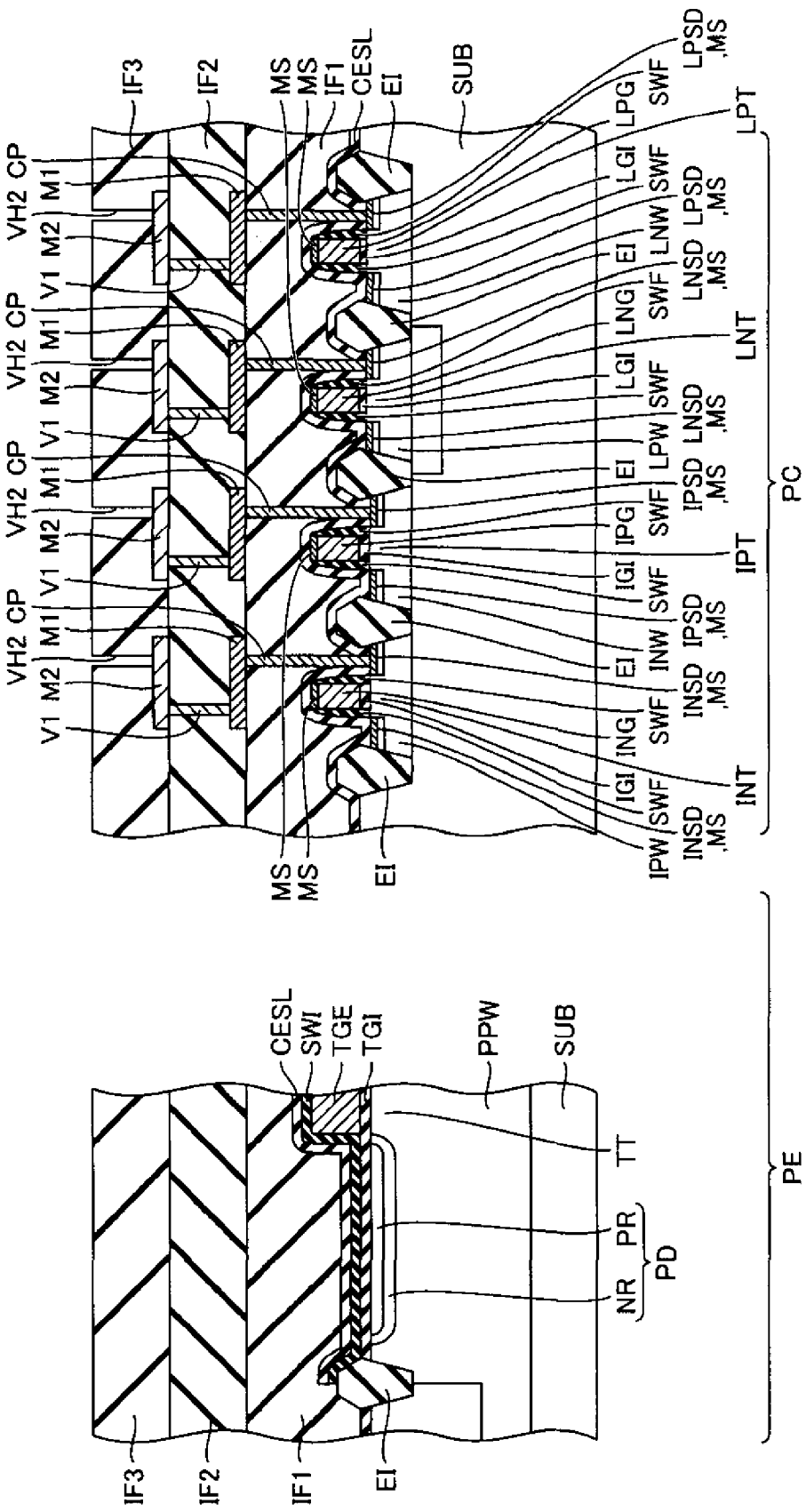
FIG. 17 is a cross-sectional view showing a process that is carried out after the process shown in FIG. 16, in the embodiment.

Next, as shown in FIG. 17, so as to cover the second wiring M2, the third interlayer insulating film IF3 is formed. Then, by performing a predetermined photolithography process, a resist pattern for forming a via hole (not shown) is formed. Subsequently, through the use of the resist pattern as a mask, etching is performed on the third interlayer insulating film IF3, and after that, the resist pattern is removed. Consequently, as shown in FIG. 17, a second via hole VH2 which allows the second wiring M2 to be exposed, is formed.

Figure 18:
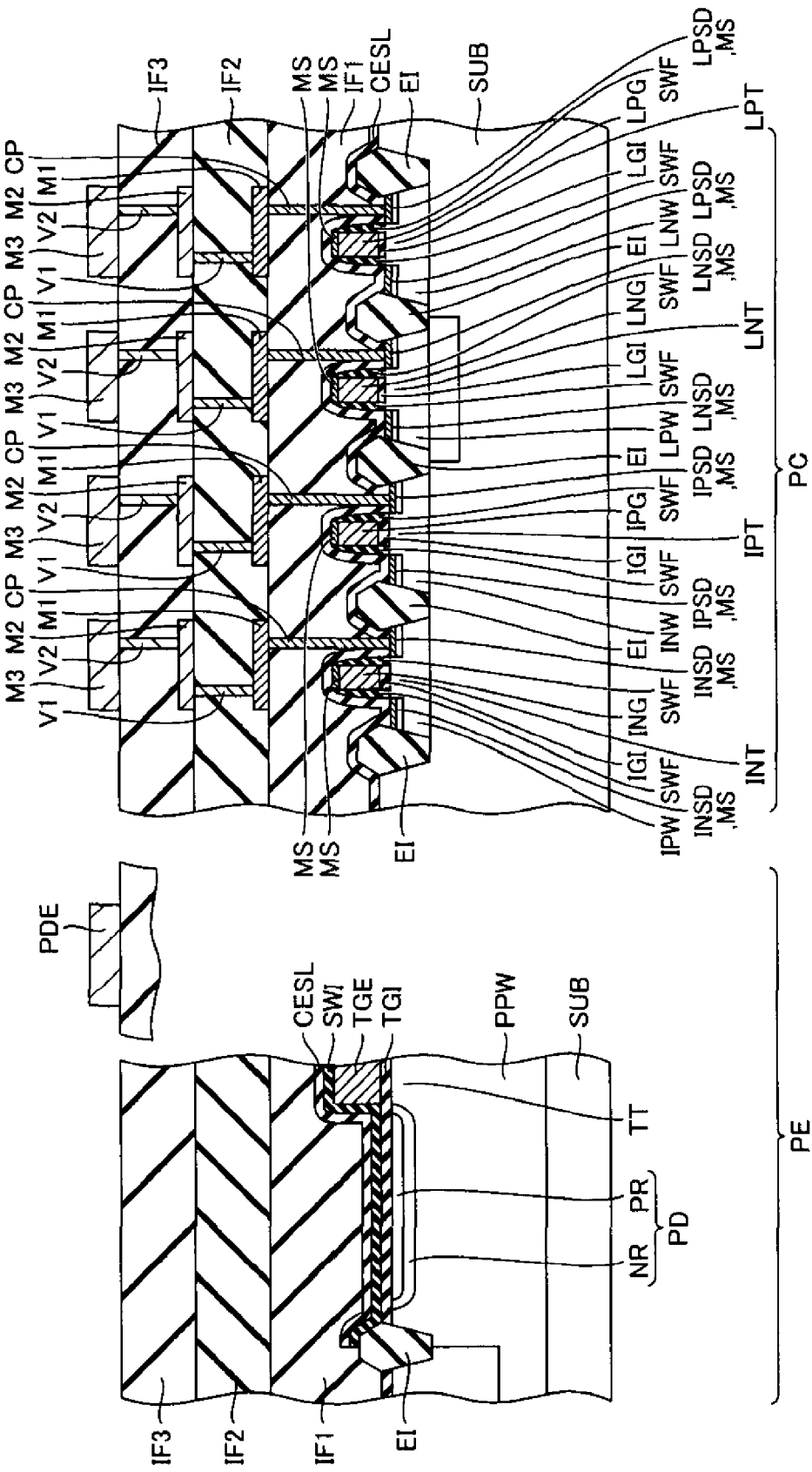
FIG. 18 is a cross-sectional view showing a process that is carried out after the process shown in FIG. 17, in the embodiment.
Figure 19:
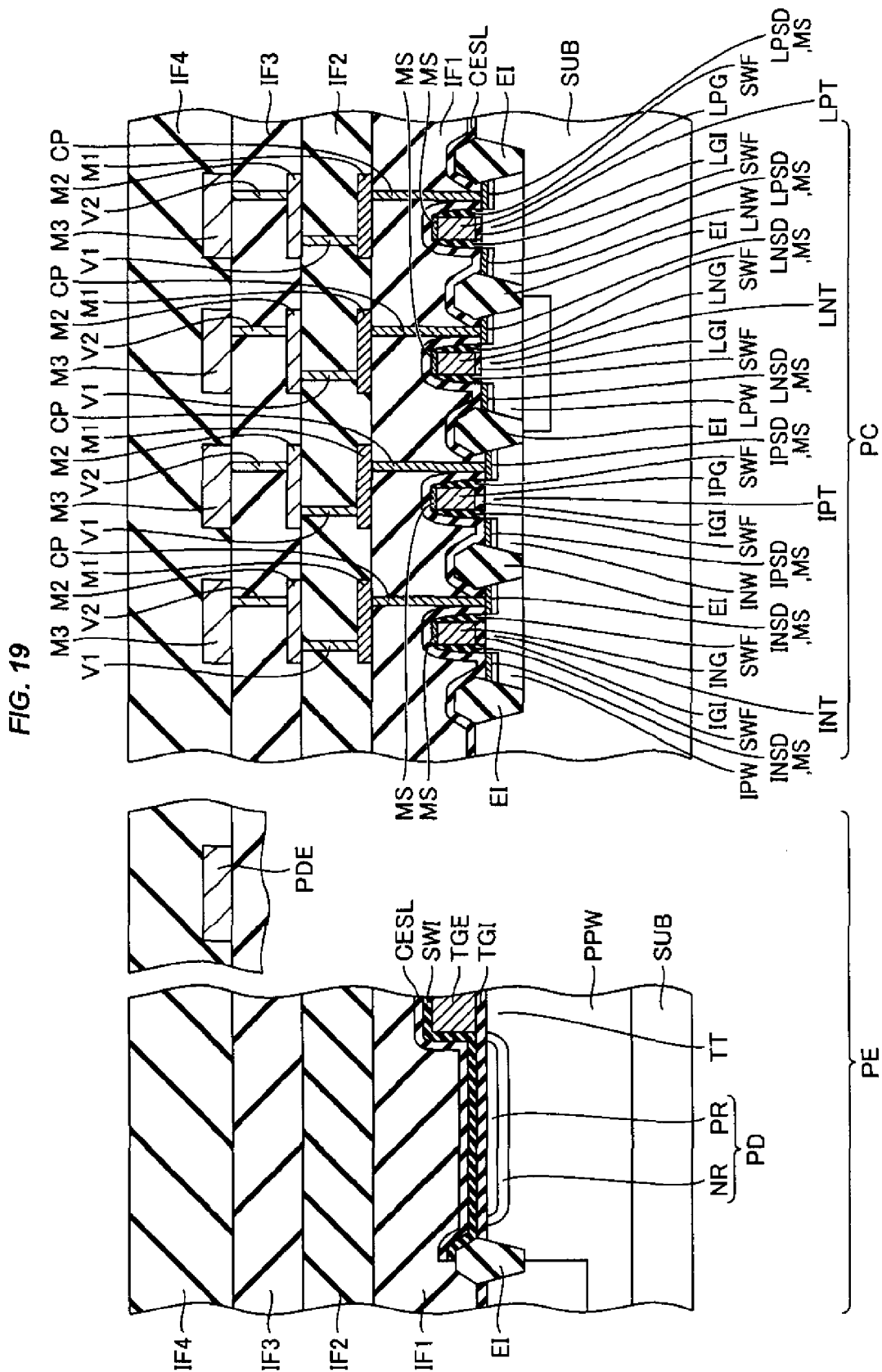
FIG. 19 is a cross-sectional view showing a process that is carried out after the process shown in FIG. 18, in the embodiment.

Next, as shown in FIG. 18, in the second via hole VH2, the second via V2 is formed. Then, so as to cover the third interlayer insulating film IF3, a metal film, for example, of aluminum or the like is formed. Subsequently, by performing a predetermined photolithography process and performing etching on the metal film, the pad PDE is formed in the pixel region PE, and in the periphery circuit region, the third wiring M3 by aluminum is formed. Then, as shown in FIG. 19, so as to cover the pad PDE and the third wiring M3, the fourth interlayer insulating film IF4 is formed.

Figure 20:
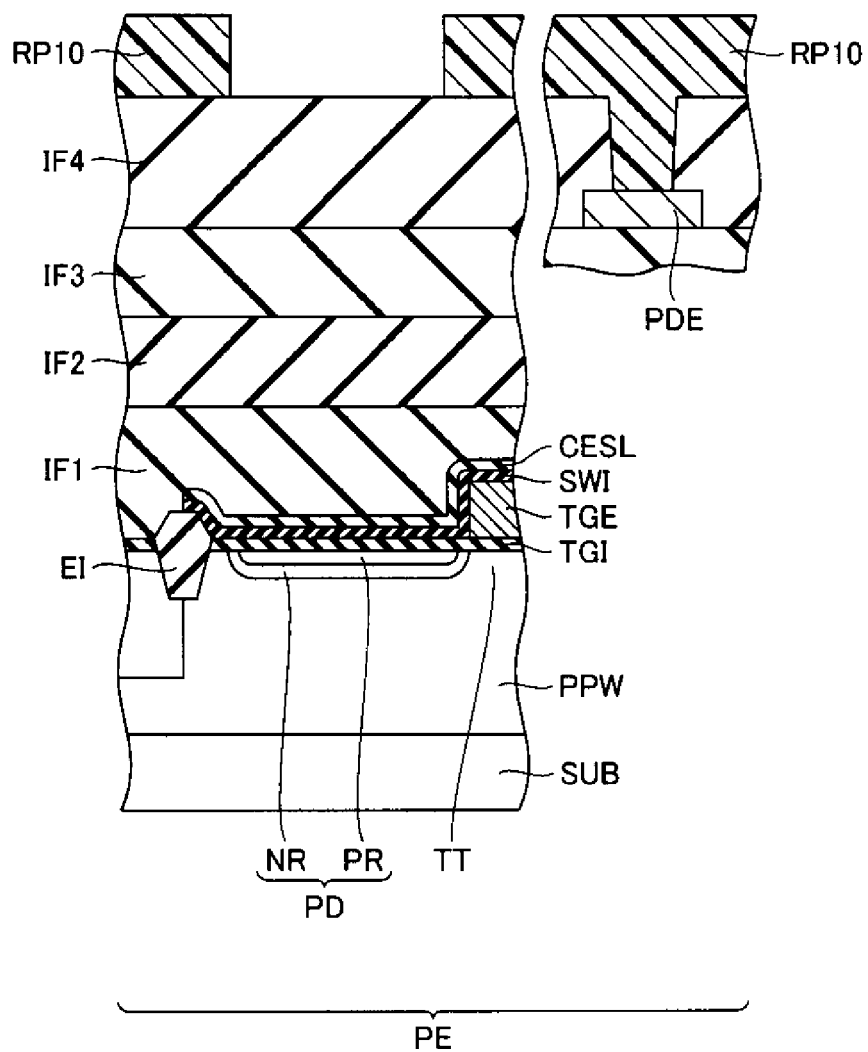
FIG. 20 is a partial cross-sectional view showing a process that is carried out after the process shown in FIG. 19, in the embodiment.
Figure 21:
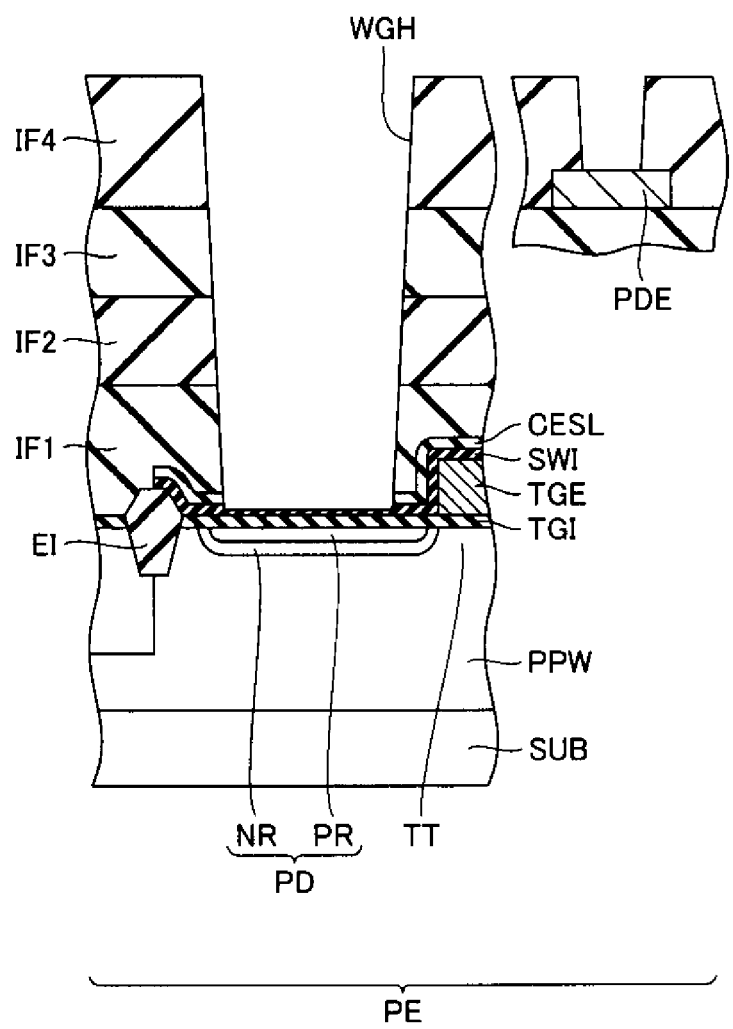
FIG. 21 is a partial cross-sectional view showing a process that is carried out after the process shown in FIG. 20, in the embodiment.

Next, in the pixel region PE, a waveguide is formed. As shown in FIG. 20, by performing a predetermined photolithography process, a resist pattern RP10 for forming a waveguide opening part serving as a waveguide is formed. Then, by performing etching on the fourth interlayer insulating film IF4 or the like through the use of the resist pattern RP10 as a mask, as shown in FIG. 21, penetrating through from the fourth interlayer insulating film IF4 to the first interlayer insulating film IF1 and the contact etch stress liner film CESL, the waveguide opening part WGH which allows the sidewall insulating film SWI to be exposed, is formed.

At this time, as the formation mode of the waveguide opening part WGH, as described already, there are two formation modes. In the first formation mode, the waveguide opening part WGH is formed so as to penetrate through even the silicon nitride film SWN of the sidewall insulating film SWI and to reach the silicon oxide film SWO of the sidewall insulating film SWI. In the second formation mode, the waveguide opening part WGH is formed so as to reach the silicon nitride film SWN of the side wall. After that, the resist pattern RP10 is removed.

Figure 22:
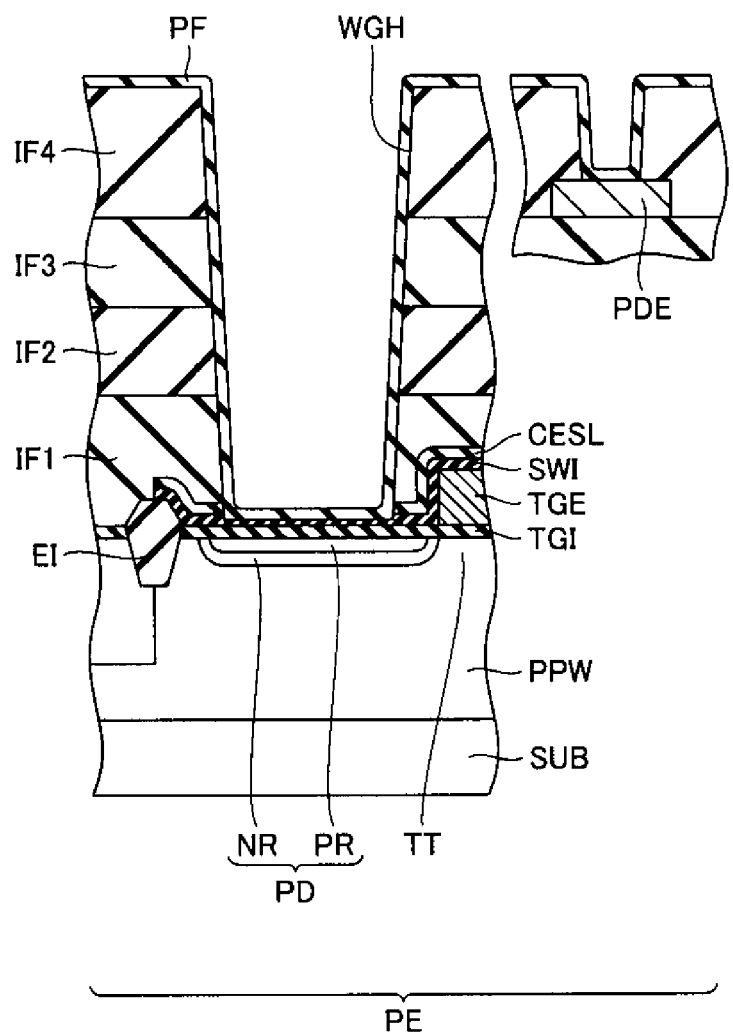
FIG. 22 is a partial cross-sectional view showing a process that is carried out after the process shown in FIG. 21, in the embodiment.
Figure 23:
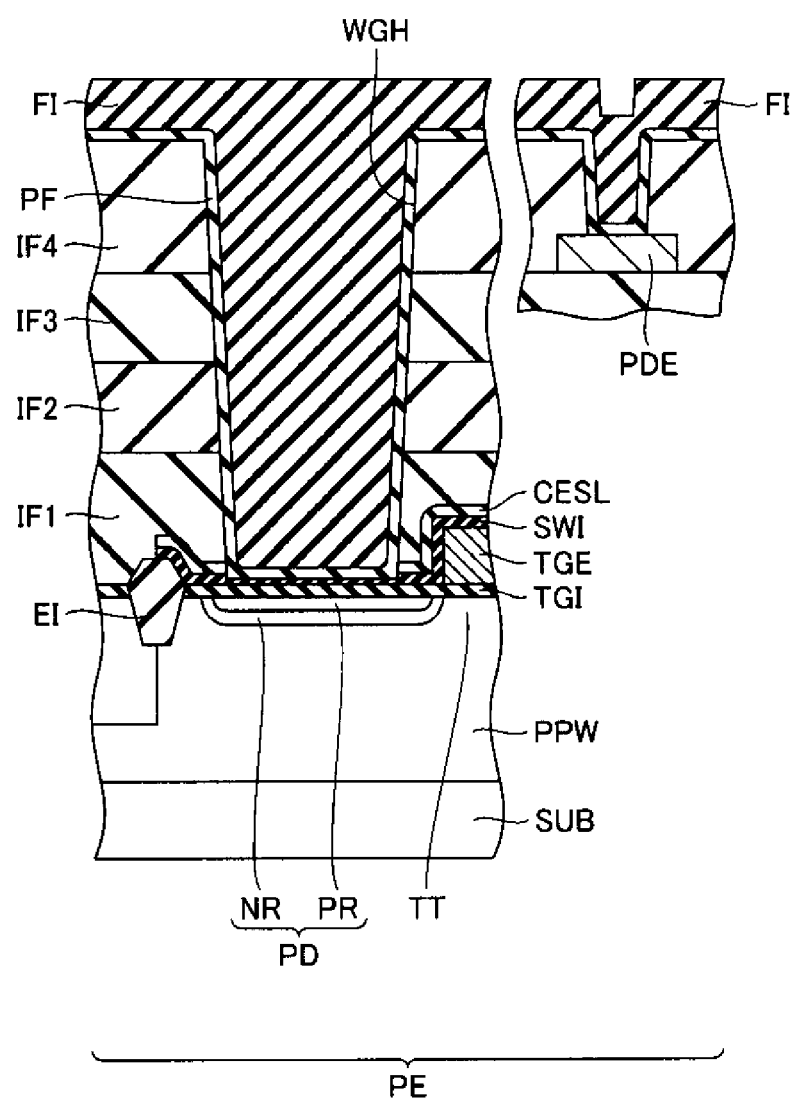
FIG. 23 is a partial cross-sectional view showing a process that is carried out after the process shown in FIG. 22, in the embodiment.
Figure 24:
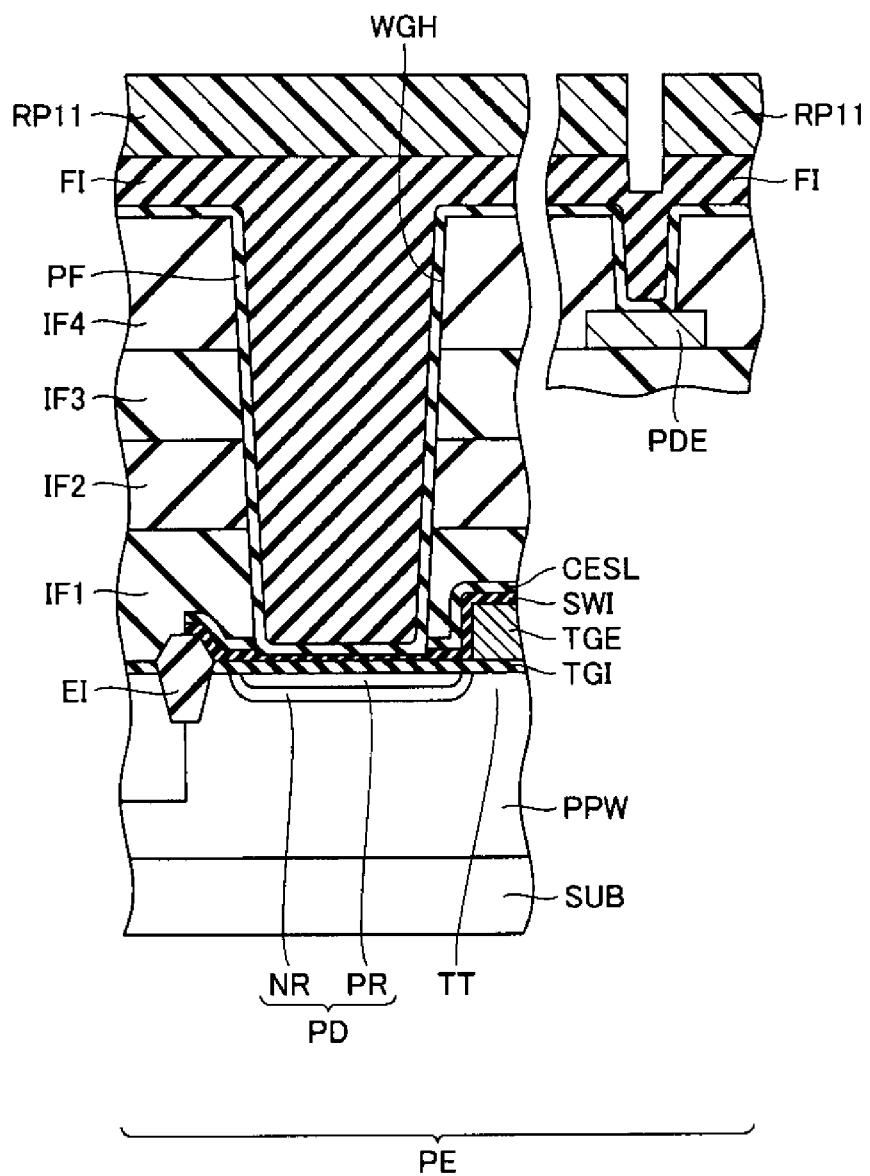
FIG. 24 is a partial cross-sectional view showing a process that is carried out after the process shown in FIG. 23, in the embodiment.
Figure 25:
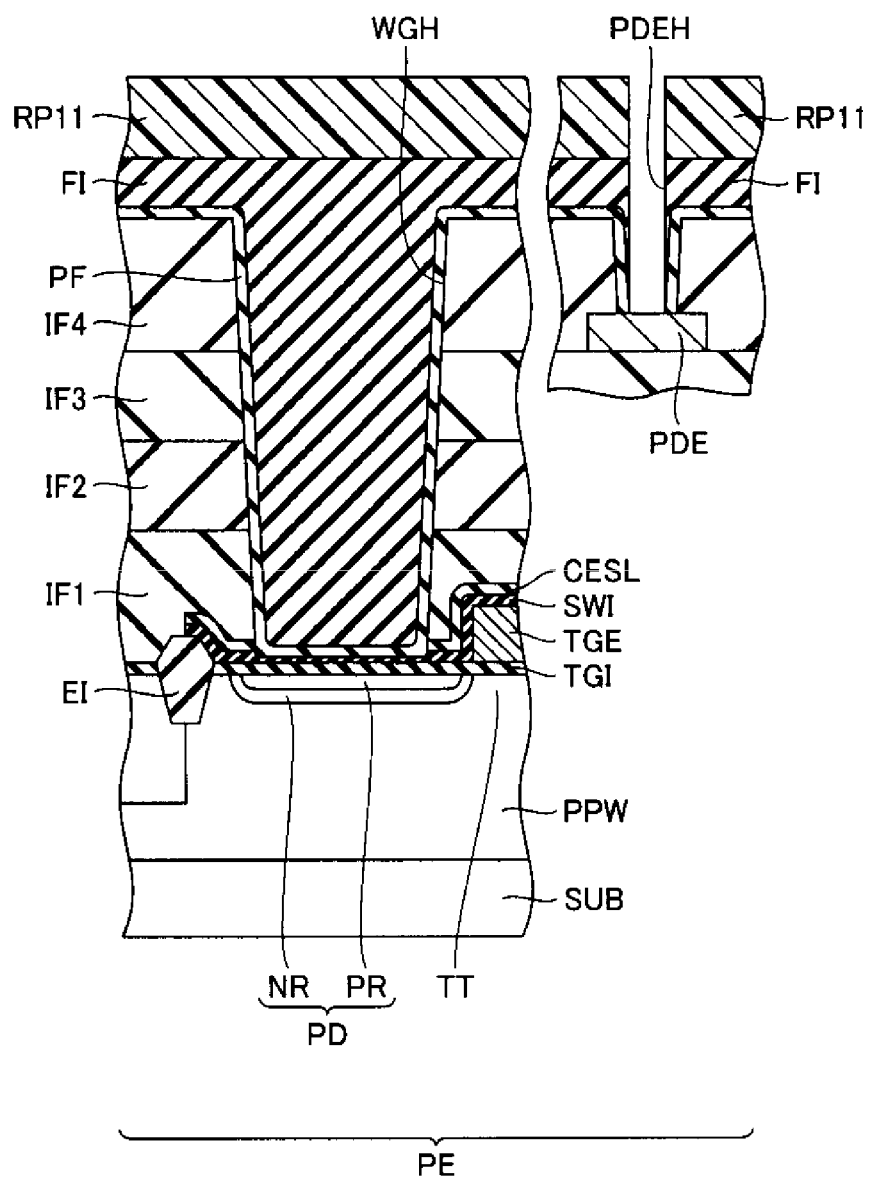
FIG. 25 is a partial cross-sectional view showing a process that is carried out after the process shown in FIG. 24, in the embodiment.

Next, as shown in FIG. 22, the protective film PF by, for example, a silicon nitride film is formed so as to cover the surface of the waveguide opening part WGH. Then, as shown in FIG. 23, the embedding member FI of, for example, siloxane as a coating-based material fills the waveguide opening part WGH. Subsequently, as shown in FIG. 24, by performing a predetermined photolithography process, a resist pattern RP11 for forming an opening which allows the pad PDE to be exposed, is formed. Next, by performing etching on the embedding member FI through the use of the resist pattern RP11 as a mask, as shown in FIG. 25, an opening part PDEH which allows the pad PDE to be exposed, is formed.

Figure 26:
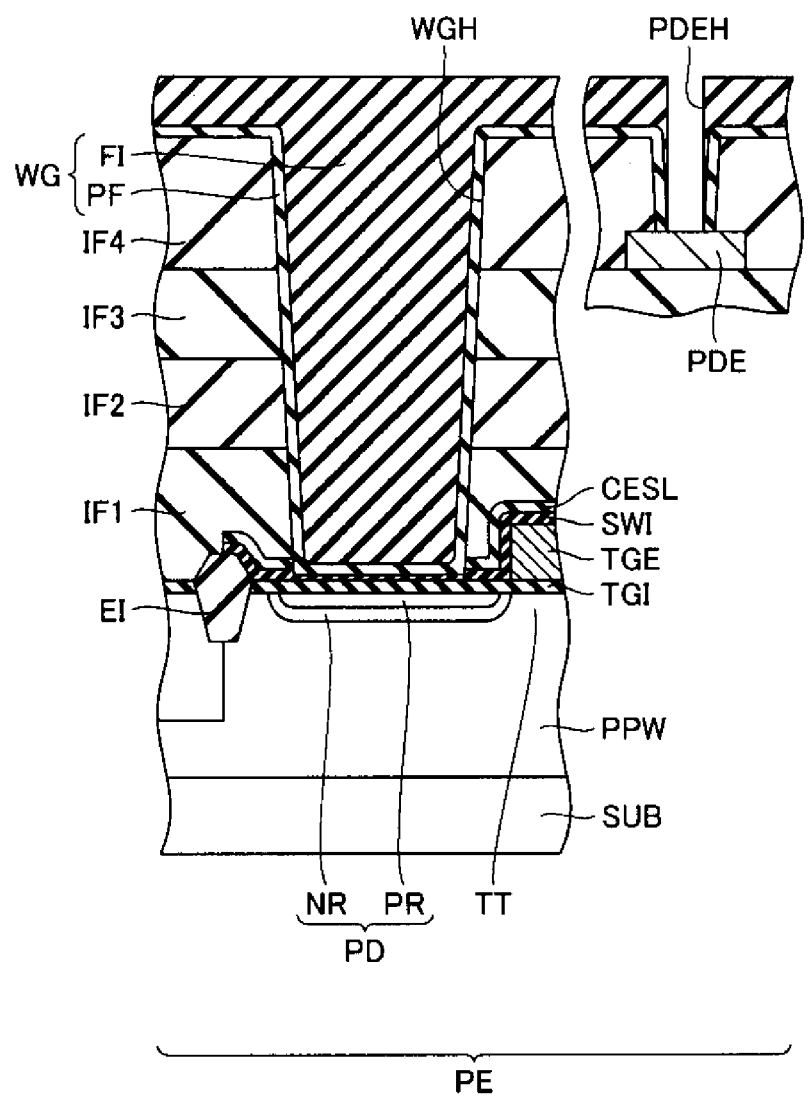
FIG. 26 is a partial cross-sectional view showing a process that is carried out after the process shown in FIG. 25, in the embodiment.

Next, as shown in FIG. 26, the resist pattern RP11 is removed and the waveguide WG is formed. After that, as shown in FIG. 1, in the periphery circuit region PC, the passivation film PAF by a silicon nitride film or the like is formed. In the pixel region PE, the color filter CF and the micro lens ML are formed. In this way, the main part of the image pickup device is formed.

In the above-mentioned image pickup device, the waveguide WG is formed so as to reach the sidewall insulating film SWI, and thus the deterioration in the sensitivity of the pixel part is suppressed. This will be explained together with an image pickup device according to a comparative example.

Figure 27:
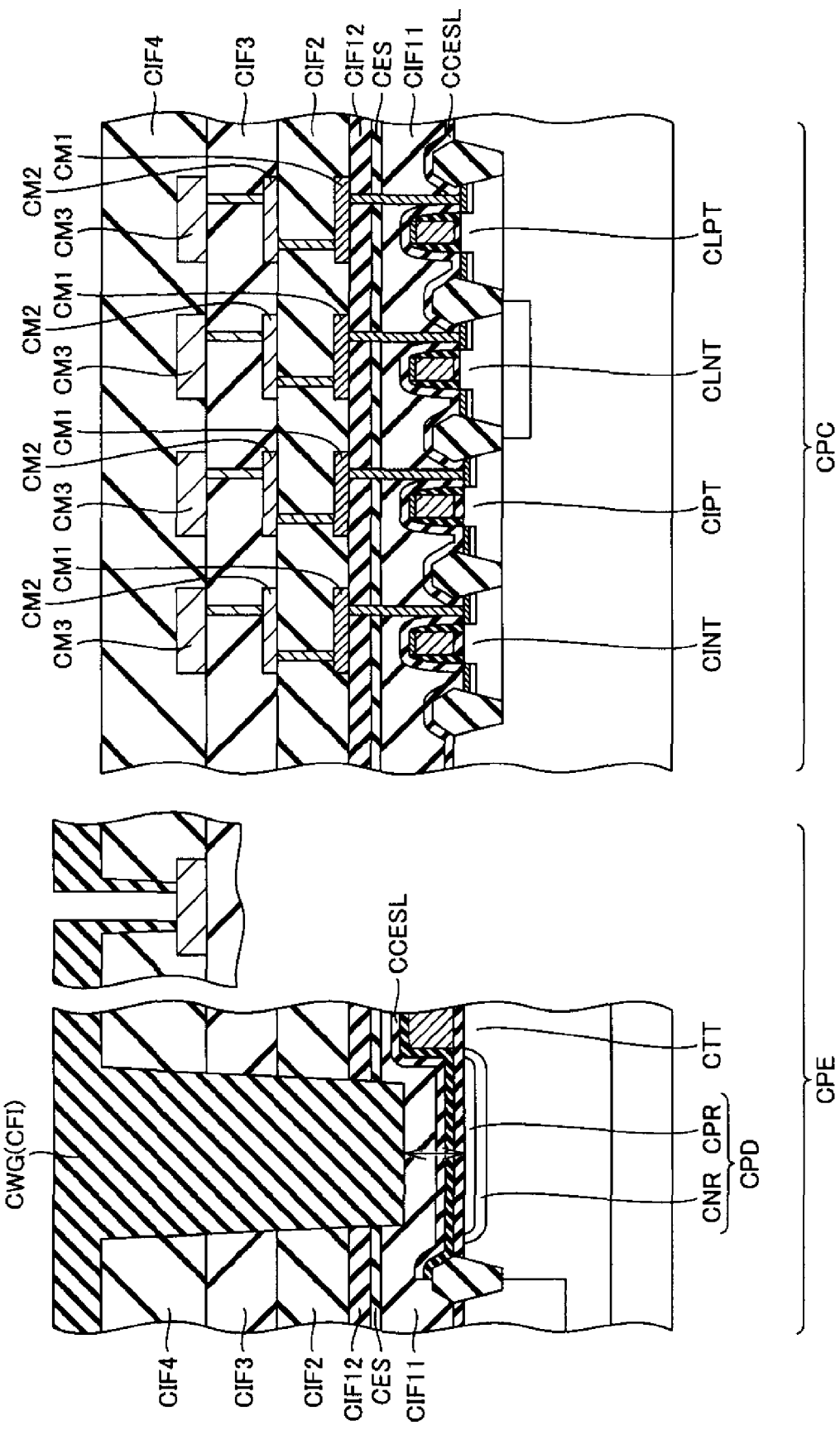
FIG. 27 is a cross-sectional view showing an image pickup device according to a comparative example.

As shown in FIG. 27, in the pixel region CPE of an image pickup device according to a comparative example, a photo diode CPD including an n-type region CNR and a p-type region CPR, and a transfer transistor CTT are formed. In the periphery circuit region CPC, as a transistor of a pixel that processes an electric signal converted from charges, an n-channel type MOS transistor CINT and a p-channel type MOS transistor CIPT are formed. In addition, as a transistor for a logic circuit that exchanges various signals, an n-channel type MOS transistor CLNT and a p-channel type MOS transistor CLPT are formed.

So as to cover these MOS transistors CINT, CIPT, CLNT and CLPT, and the transfer transistor CTT, a contact etch stress liner film CCESL by a silicon nitride film is formed, and so as to cover the contact etch stress liner film CCESL, a first lower interlayer insulating film CIF11 is formed. Over the first lower interlayer insulating film CIF11, a first upper interlayer insulating film CIF12 is formed, with an etching stopper film CES by a silicon nitride film being interposed. Over the surface of the first upper interlayer insulating film CIF12, a first wiring CM1 is formed.

So as to cover the first wiring CM1, a second interlayer insulating film CIF2 is formed. On the surface of the second interlayer insulating film CIF2, a second wiring CM2 is formed. So as to cover the second wiring CM2, a third interlayer insulating film CIF3 is formed. On the third interlayer insulating film CIF3, a third wiring CM3 is formed. So as to cover the third wiring CM3, a fourth interlayer insulating film CIF4 is formed.

Figure 28:
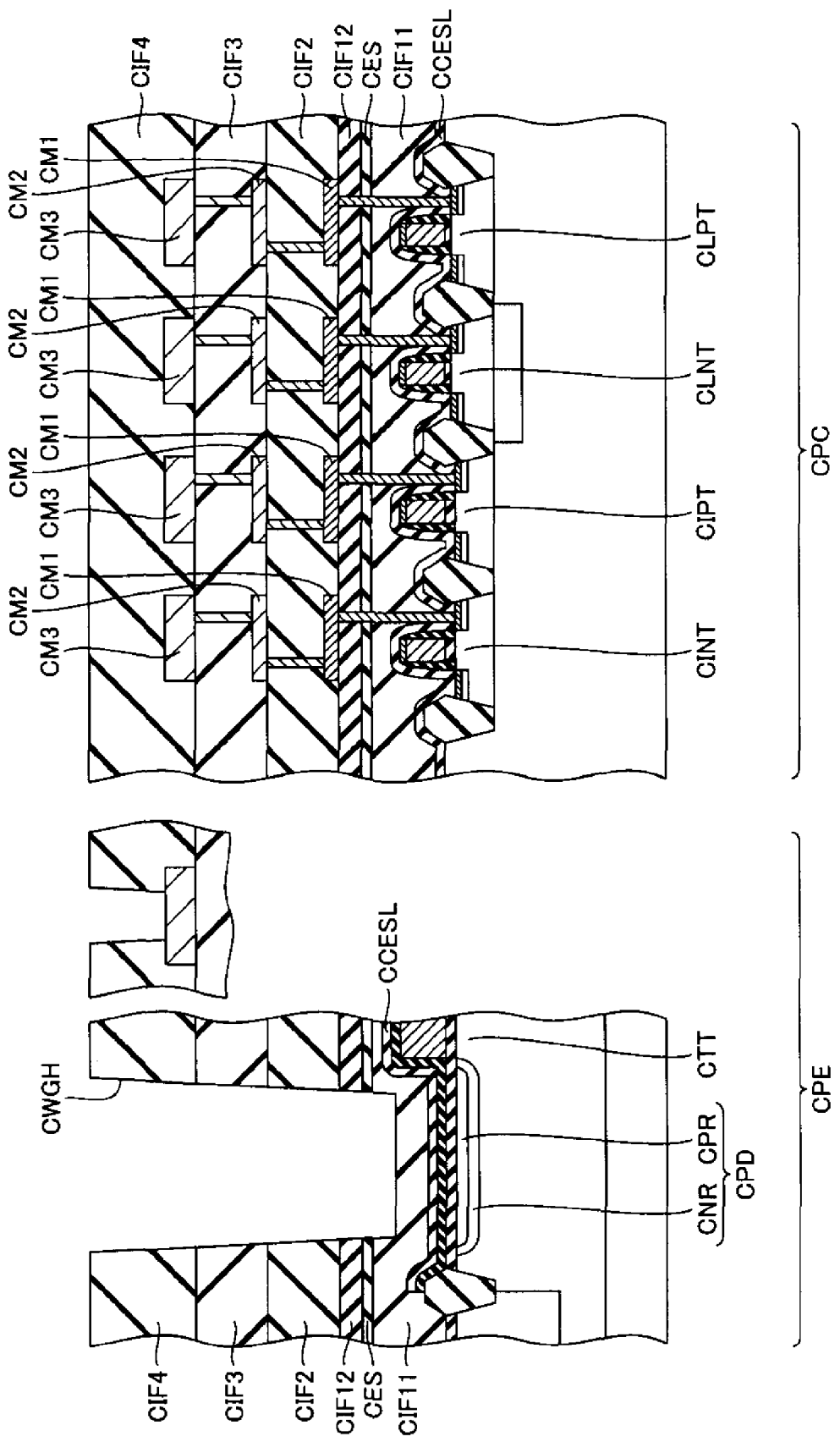
FIG. 28 is a cross-sectional view showing a process of a method of manufacturing an image pickup device according to a comparative example.

In the image pickup device according to a comparative example, in order to control the distance between the waveguide and the photo diode CPD, between the first lower interlayer insulating film CIF11 as a contact interlayer film and the first upper interlayer insulating film CIF12, the etching stopper film CES is being interposed. However, in order to avoid the decay of light caused by a reflection prevention effect due to the etching stopper film CES by a silicon nitride film, a waveguide CWG is formed so as to penetrate through the etching stopper film CES and to reach the first lower interlayer insulating film CIF11. That is, as shown in FIG. 28, a waveguide opening part CWGH serving as a waveguide is formed so as to reach the first lower interlayer insulating film CIF11.

Therefore, in the image pickup device according to a comparative example, there remains variation in the distance between the waveguide CWG and the photo diode CPD (see an arrow in FIG. 27), and the variation in the distance becomes a factor for causing the variation in the sensitivity of the photo diode CPD. In addition, the contact etch stress liner film CCESL covering the transfer transistor CTT acts as an antireflection film to lead to the decay of light. Consequently, the sensitivity of the photo diode CPD deteriorates.

Furthermore, the etching stopper film CES by a silicon nitride film is formed on the entire surface of the semiconductor substrate. Consequently, in the periphery circuit region, the interlayer capacity between the MOS transistors CINT, CIPT, CLNT and CLPT, and the etching stopper film CES increases to thereby lower the operation speed.

Moreover, between the first lower interlayer insulating film CIF11 and the first upper interlayer insulating film CIF12, the etching stopper film CES having different etching properties is being interposed, and thus when forming a contact hole, the etching speeds of the first lower interlayer insulating film CIF11 and the first upper interlayer insulating film CIF12 become different from the etching speed of the etching stopper film CES. Consequently, there is a case where the opening diameter of the contact hole varies to thereby prevent good conduction between the MOS transistors CINT, CIPT, CLNT and CLPT, and the first wiring CM1 from being performed. Furthermore, barrier properties of a barrier metal of the contact plug formed in the contact hole may deteriorate.

In contrast to a comparative example, in the image pickup device according to the embodiment, in the first interlayer insulating film IF1 as the contact interlayer insulating film, no etching stopper film having different etching properties is being interposed. The waveguide WG is formed so as to penetrate through the fourth interlayer insulating film IF4, the third interlayer insulating film IF3, the second interlayer insulating film IF2, the first interlayer insulating film IF1 and the contact etch stress liner film CESL, to thereby reach the sidewall insulating film SWI.

The sidewall insulating film SWI extends from the part covering the side wall face of the gate electrode TGE of the transfer transistor TT, to cover the photo diode PD. Therefore, the sidewall insulating film SWI is positioned near the surface of the photo diode PD. Consequently, it is possible to make short the distance between waveguide WG formed so as to reach the sidewall insulating film SWI, and the photo diode PD, and to enhance the sensitivity of the photo diode PD. In addition, in proportion to the distance by which the waveguide WG comes closer to the photo diode PD, the variation in the sensitivity of the photo diode PD relative to the variation in the thickness of the remaining film between the waveguide WG and the photo diode PD, which corresponds to the distance, becomes smaller.

Furthermore, an etching stopper film by a silicon nitride film is not formed on the entire face of the semiconductor substrate. Consequently, differing from the image pickup device according to a comparative example, there is no interlayer capacity and, in the periphery circuit region PC, the operation speeds of the MOS transistors INT, IPT, LNT and LPT do not lower. In addition, differing from the image pickup device according to a comparative example, the opening diameter of the contact hole does not vary, and the conduction between the MOS transistors CINT, CIPT, CLNT and CLPT, and the first wiring CM1 can favorably be performed. Furthermore, barrier properties of the barrier metal (not shown) of the contact plug CP formed in the contact hole CH do not deteriorate. In addition, by enhancement of the sensitivity of the photo diode, an inclination angle (a taper angle) of the waveguide opening part WGH of the waveguide WG may be made gentle and the process margin of etching is enhanced.

Modification

Figure 29:
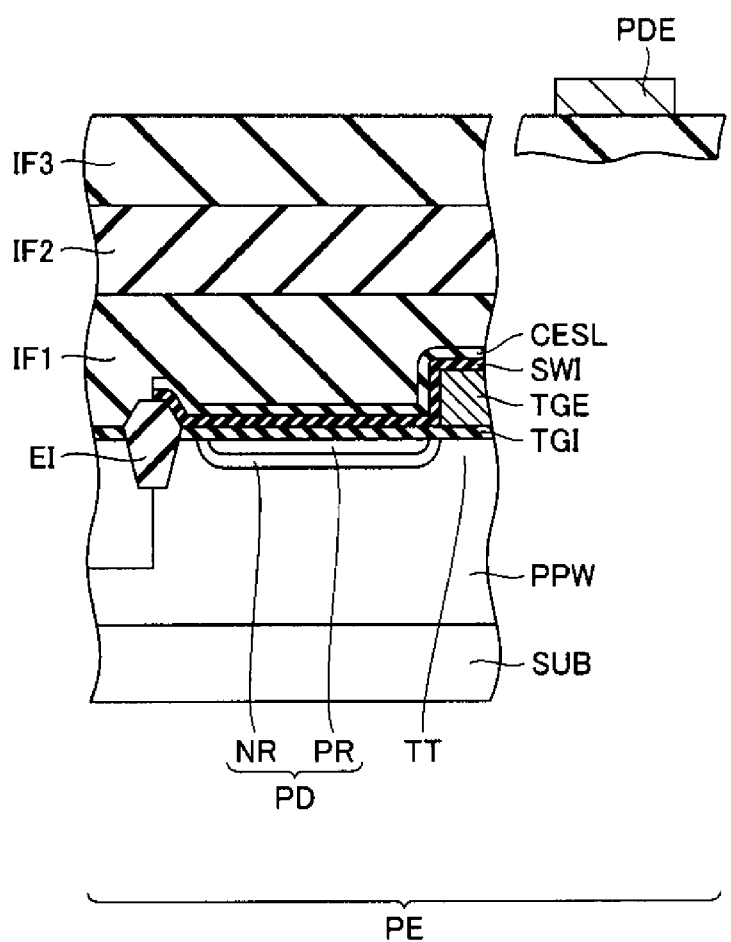
FIG. 29 is a partial cross-sectional view showing a process of manufacturing an image pickup device according to a modification, in the embodiment.

In the above-mentioned image pickup device, the case where the waveguide WG is formed using a coating-based material has been explained. As the waveguide, in addition to a coating-based material, for example, a CVD (Chemical Vapor Deposition)-based film may be applied. A method of manufacturing the same will be explained. Going through the same processes as processes shown in FIG. 4 to FIG. 18, as shown in FIG. 29, the pad PDE is formed on the surface of the third interlayer insulating film IF3 in the pixel region PE.

Figure 30:
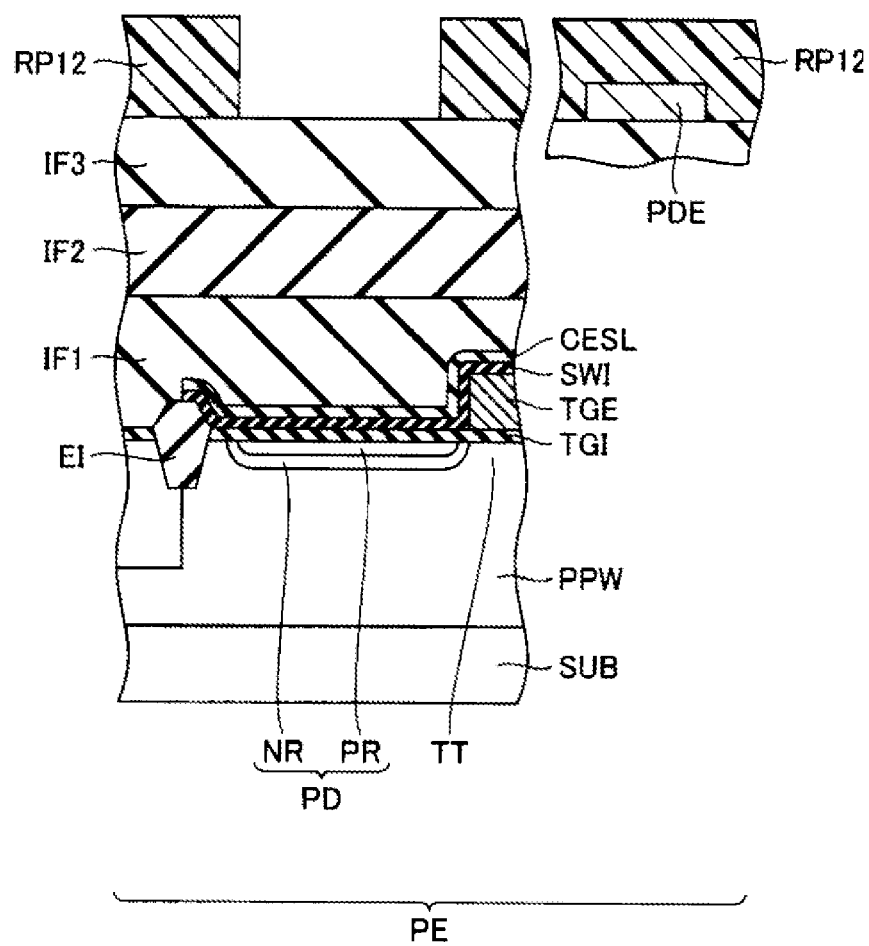
FIG. 30 is a partial cross-sectional view showing a process that is carried out after the process shown in FIG. 29, in the embodiment.
Figure 31:
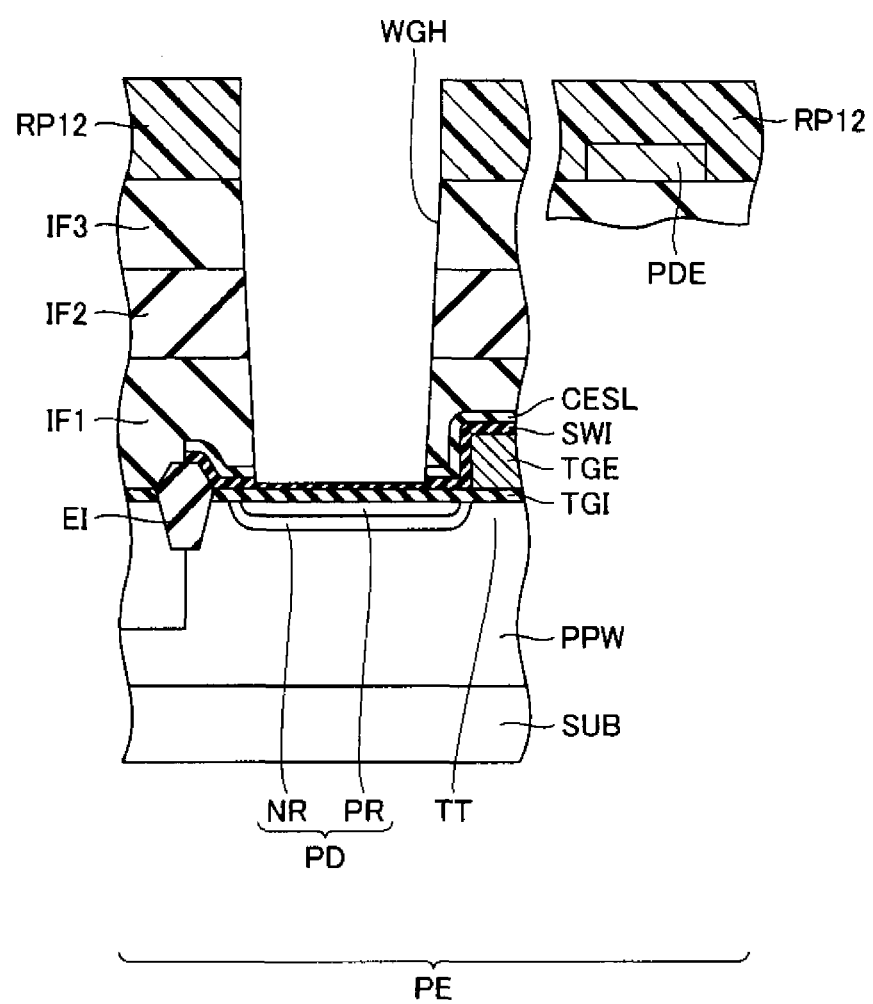
FIG. 31 is a partial cross-sectional view showing a process that is carried out after the process shown in FIG. 30, in the embodiment.
Figure 32:
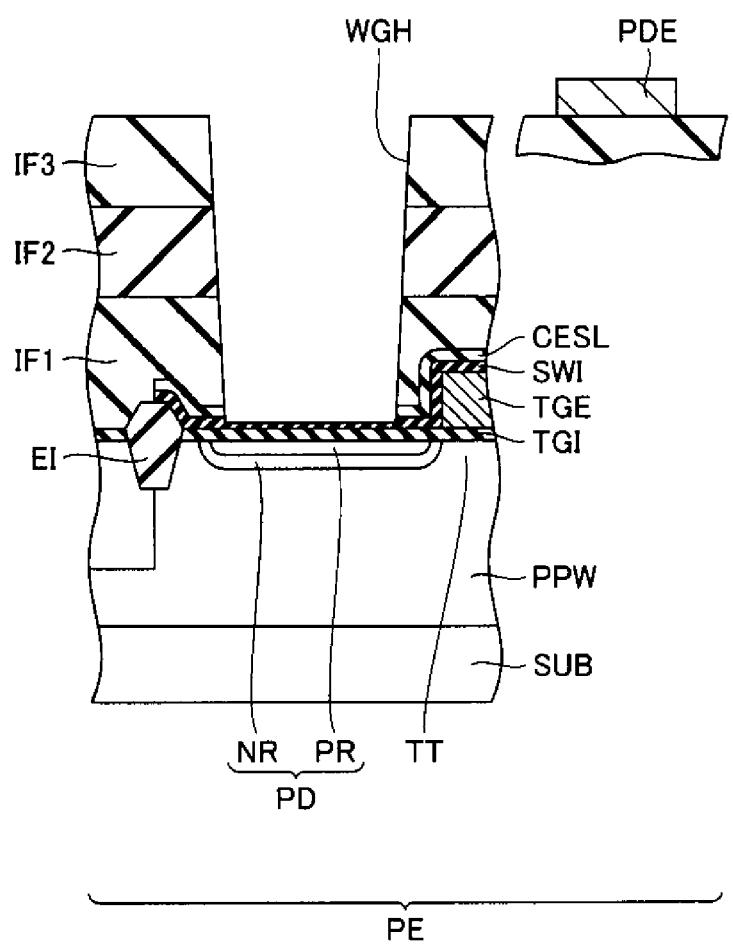
FIG. 32 is a partial cross-sectional view showing a process that is carried out after the process shown in FIG. 31, in the embodiment.

Next, as shown in FIG. 30, by performing a predetermined photolithography process, a resist pattern RP12 for forming a waveguide opening part serving as a waveguide is formed. Next, through the use of the resist pattern RP12 as a mask, etching is performed on the third interlayer insulating film IF3 or the like, and thus, as shown in FIG. 31, the waveguide opening part WGH is formed, while penetrating through the third interlayer insulating film IF3 to the first interlayer insulating film IF1 and the contact etch stress liner film CESL, and allowing the sidewall insulating film SWI to be exposed. After that, as shown in FIG. 32, the resist pattern RP12 is removed.

Figure 33:
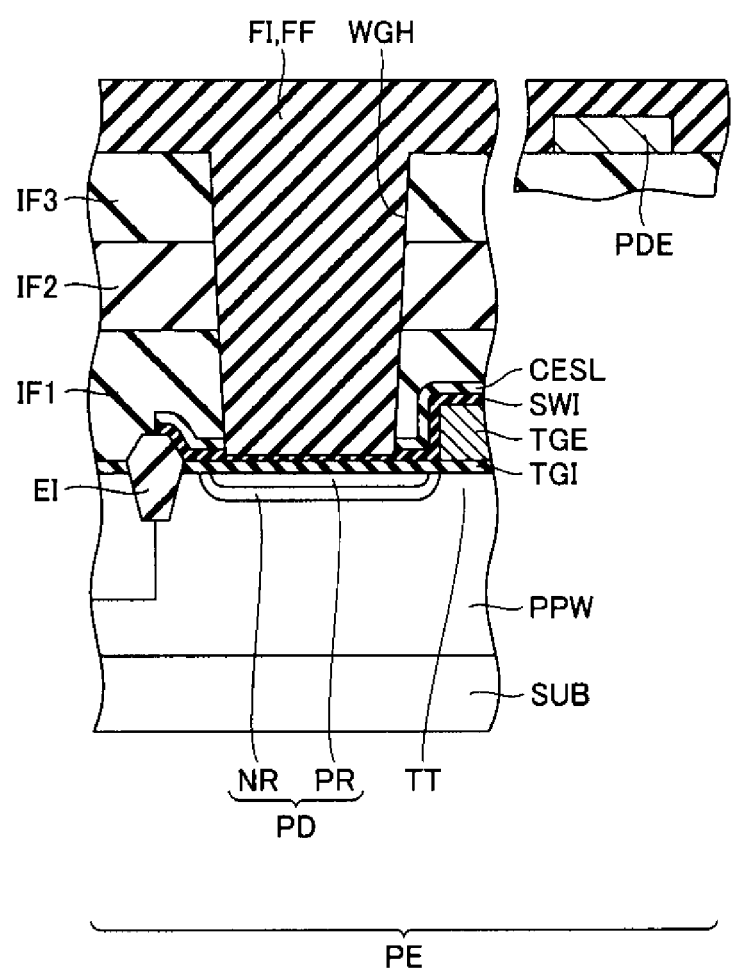
FIG. 33 is a partial cross-sectional view showing a process that is carried out after the process shown in FIG. 32, in the embodiment.
Figure 34:
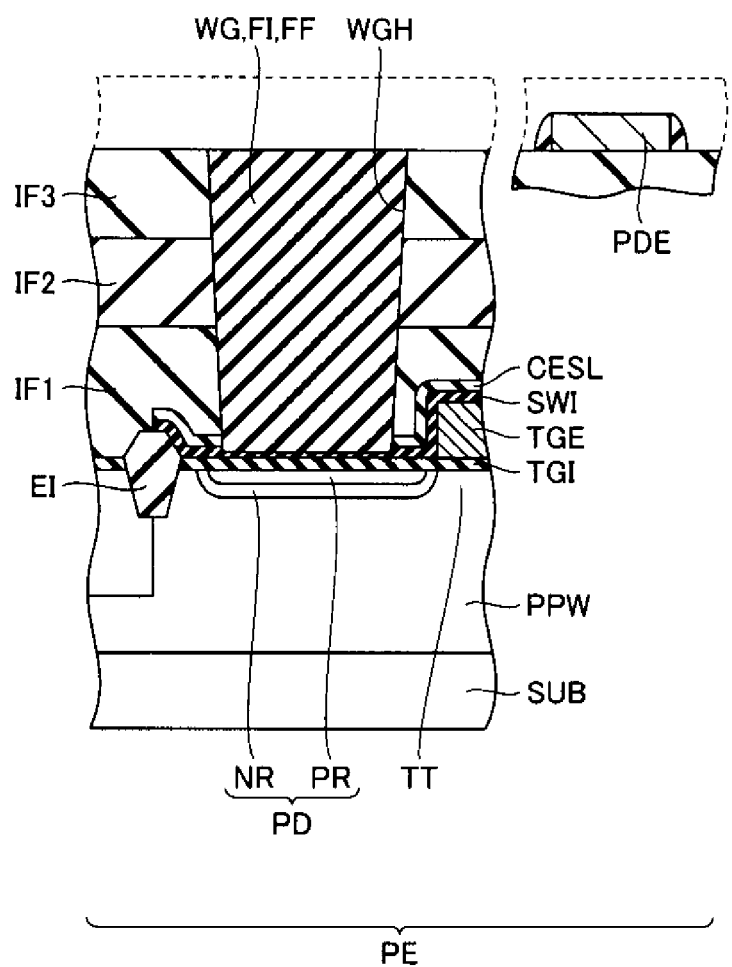
FIG. 34 is a partial cross-sectional view showing a process that is carried out after the process shown in FIG. 33, in the embodiment.

Next, as shown in FIG. 33, by a chemical vapor deposition method, in a mode of filling the waveguide opening part WGH, an embedding film. FF of, for example, a silicon nitride film or the like is formed. Next, by performing etch back processing on the embedding film FF, as shown in FIG. 34, the embedding film FF positioned over the upper face of the third interlayer insulating film IF3 is removed. In this way, the embedding film FF left in the waveguide opening part WGH is formed as the waveguide WG. After that, while going through the same processes as the processes in the above-mentioned manufacturing method, the main part of the image pickup device is formed.

Also in the image pickup device according to the modification, the waveguide WG including the embedding film FF is formed so as to penetrate through the third interlayer insulating film IF3 and the like and to reach the sidewall insulating film SWI. Because of this, in the same manner as the image pickup device mentioned above, it is possible to enhance the sensitivity of the photo diode PD.

Meanwhile, in the above-mentioned image pickup device, as the wiring material of the first wiring M1 to the third wiring M3, aluminum has been explained as an example. As the wiring material is not limited to aluminum, but, also to copper (wiring), the above-mentioned structure of the waveguide may be applied.

Hereinbefore, although the invention made by the present inventors has been specifically explained on the basis of the embodiments, it is needless to say that the present invention is not limited to the embodiments and can be modified variously within the scope not departing from the gist thereof.

What is claimed is:

1. An image pickup device, comprising:
a semiconductor substrate having a main surface;
a photoelectric conversion part that is formed in a predetermined region in the semiconductor substrate and converts entering light into a charge;
a gate electrode of a transfer transistor that is formed over a surface of the semiconductor substrate and transfers the charge generated in the photoelectric conversion part;
a sidewall insulating film that covers a side wall face of the gate electrode and that includes a part extending from a part covering the side wall face and covering a surface of the photoelectric conversion part;
an interlayer insulating film formed so as to cover the sidewall insulating film; and
a waveguide that is formed so as to penetrate through the interlayer insulating film and to reach the sidewall insulating film, and guides light to the photoelectric conversion part.

2. The image pickup device according to claim 1,
wherein the sidewall insulating film includes:
a silicon oxide film; and
a silicon nitride film formed so as to be in contact with a surface of the silicon oxide film, and
wherein the waveguide is formed so as to penetrate through the interlayer insulating film and the silicon nitride film and to reach the silicon oxide film.

3. The image pickup device according to claim 2, wherein the waveguide is formed directly above the silicon oxide film and the waveguide contacts the silicon oxide film.

4. The image pickup device according to claim 2, wherein the waveguide is formed directly above the silicon nitride film and the waveguide contacts the silicon nitride film.

5. The image pickup device according to claim 1,
wherein the sidewall insulating film includes:
a silicon oxide film; and
a silicon nitride film formed so as to be in contact with an upper face of the silicon oxide film, and
wherein the waveguide is formed so as to penetrate through the interlayer insulating film and to reach the silicon nitride film.

6. The image pickup device according to claim 1,
wherein the waveguide includes:
a protective film covering a surface of an opening part penetrating through the interlayer insulating film; and
an embedding member filling the opening part covered with the protective film.

7. The image pickup device according to claim 6,
wherein the protective film is a silicon nitride film; and
wherein the embedding member is a coating-based material.

8. The image pickup device according to claim 1,
wherein the waveguide includes a predetermined film filling an opening part penetrating through the interlayer insulating film.

9. The image pickup device according to claim 8,
wherein the predetermined film is a silicon nitride film.

10. The image pickup device according to claim 1, wherein the waveguide is formed directly above the sidewall insulating film and the waveguide contacts the sidewall insulating film.

11. A method of manufacturing an image pickup device, the method comprising the steps of:
forming a gate electrode of a transfer transistor transferring a charge, on a surface of a semiconductor substrate having a main surface;
forming a photoelectric conversion part converting entering light into a charge by implanting an impurity of a predetermined conduction type into one of regions of the semiconductor substrate, positioned with the gate electrode being interposed;
forming a sidewall insulating film that covers a side wall face of the gate electrode and that includes a part extending from a part covering the side wall face to cover a surface of the photoelectric conversion part, by forming a predetermined insulating film so as to cover the gate electrode and the photoelectric conversion part and by performing processing on the predetermined insulating film;
forming an interlayer insulating film so as to cover the sidewall insulating film;
forming an opening part reaching the sidewall insulating film in the interlayer insulating film; and
forming a waveguide guiding light to the photoelectric conversion part so as to fill the opening part.

12. The method of manufacturing an image pickup device according to claim 11, the step of forming the sidewall insulating film including the steps of:
- forming a silicon oxide film; and
- forming a silicon nitride film so as to be in contact with a surface of the silicon oxide film,
- as the predetermined insulating film,
- wherein, in the step of forming the opening part, the opening part is formed so as to penetrate through the interlayer insulating film and to allow the silicon nitride film to be exposed; and
- wherein, in the step of forming the waveguide, the waveguide is formed so as to reach the silicon nitride film.

13. The method of manufacturing an image pickup device according to claim 12, wherein the waveguide is formed directly above the silicon oxide film and the waveguide contacts the silicon oxide film.

14. The method of manufacturing an image pickup device according to claim 12, wherein the waveguide is formed directly above the silicon nitride film and the waveguide contacts the silicon nitride film.

15. The method of manufacturing an image pickup device according to claim 11, the step of forming the sidewall insulating film including the steps of:
- forming a silicon oxide film; and
- forming a silicon nitride film so as to be in contact with a surface of the silicon oxide film,
- as the predetermined insulating film,
- wherein, in the step of forming the opening part, the opening part is formed so as to penetrate through the interlayer insulating film and the silicon nitride film and to allow the silicon oxide film to be exposed; and
- wherein, in the step of forming the waveguide, the waveguide is formed so as to reach the silicon oxide film.

16. The method of manufacturing an image pickup device according to claim 11, the step of forming the waveguide including the steps of:
- forming a protective film so as to cover a surface of the opening part; and
- filling a coating-based material in the opening part covered with the protective film.

17. The method of manufacturing an image pickup device according to claim 16,
- wherein, in the step of forming the waveguide, siloxane is applied as the coating-based material.

18. The method of manufacturing an image pickup device according to claim 11,
- wherein the step of forming the waveguide includes a step of forming a predetermined film so that the film is embedded in the opening part.

19. The method of manufacturing an image pickup device according to claim 18,
- wherein, in the step of forming the waveguide, a silicon nitride film is applied as the predetermined film.

20. The method of manufacturing an image pickup device according to claim 11, wherein the waveguide is formed directly above the sidewall insulating film and the waveguide contacts the sidewall insulating film.

* * * * *